(12) United States Patent
Ryckaert et al.

(10) Patent No.: US 12,324,175 B2
(45) Date of Patent: Jun. 3, 2025

(54) FET DEVICE AND A METHOD FOR FORMING A FET DEVICE

(71) Applicant: IMEC VZW, Leuven (BE)

(72) Inventors: Julien Ryckaert, Schaerbeek (BE); Naoto Horiguchi, Leuven (BE); Boon Teik Chan, Wilsele (BE)

(73) Assignee: IMEC VZW, Leuven (BE)

(*) Notice: Subject to any disclaimer, the term of this patent is extended or adjusted under 35 U.S.C. 154(b) by 553 days.

(21) Appl. No.: 17/550,383

(22) Filed: Dec. 14, 2021

(65) Prior Publication Data

US 2022/0199809 A1    Jun. 23, 2022

(30) Foreign Application Priority Data

Dec. 22, 2020    (EP) .................................. 20216325

(51) Int. Cl.
*H01L 29/78* (2006.01)
*H10D 30/01* (2025.01)
(Continued)

(52) U.S. Cl.
CPC ....... *H10D 30/024* (2025.01); *H10D 30/6211* (2025.01); *H10D 62/151* (2025.01);
(Continued)

(58) Field of Classification Search
None
See application file for complete search history.

(56) References Cited

U.S. PATENT DOCUMENTS

| 2016/0111337 A1 | 4/2016 | Hatcher et al. | |
| 2017/0148907 A1* | 5/2017 | Wu | H01L 29/1054 |
| 2021/0210598 A1* | 7/2021 | Cheng | H01L 29/66545 |

FOREIGN PATENT DOCUMENTS

| CN | 111584486 A | 8/2020 |
| CN | 111755333 A | 10/2020 |

OTHER PUBLICATIONS

Weckx P et al., "Stacked nanosheet fork architecture for SRAM design and device co-optimization toward 3nm", 2017 IEEE International Electron Devices Meeting (IEDM), IEEE, Dec. 2, 2017 (Dec. 2, 2017), XP033306012, DOI: 10.1109/IEDM.2017.8268430.
(Continued)

*Primary Examiner* — Joseph C. Nicely
*Assistant Examiner* — Lamont B Koo
(74) *Attorney, Agent, or Firm* — MOSER TABOADA

(57) ABSTRACT

According to an aspect there is provided a FET device. The FET device comprises a common source body portion and a set of source layer prongs protruding therefrom in a first lateral direction. First dielectric layer portions are arranged in spaces between the source layer prongs. The device further comprises a common drain body portion and a set of drain layer prongs protruding in the first lateral direction. Second dielectric layer portions are arranged in spaces between the drain layer prongs. The device further comprises a gate body comprising a common gate body portion and a set of gate prongs protruding therefrom in a second lateral direction opposite the first lateral direction. Each gate prong is formed intermediate a respective pair of first and second dielectric layer portions. The device further comprises a channel region comprising a set of channel layer portions. Each channel layer portion extends between a respective pair of source and drain layer prongs. The channel layer portions are arranged in spaces between the gate prongs. There is also provided a method for forming a FET device.

5 Claims, 12 Drawing Sheets

(51) Int. Cl.
    *H10D 30/62*     (2025.01)
    *H10D 62/13*     (2025.01)
    *H10D 62/17*     (2025.01)
    *H10D 84/01*     (2025.01)
    *H10D 84/03*     (2025.01)

(52) U.S. Cl.
    CPC ....... *H10D 62/235* (2025.01); *H10D 84/0128* (2025.01); *H10D 84/013* (2025.01); *H10D 84/0158* (2025.01); *H10D 84/038* (2025.01)

(56) References Cited

OTHER PUBLICATIONS

Weckx P et al., "Novel forksheet device architecture as ultimate logic scaling device towards 2nm", 2019 IEEE International Electron Devices Meeting (IEDM), IEEE, Dec. 7, 2019 (Dec. 7, 2019), XP033714586, DOI: 10.1109/IEDM19573.2019.8993635.
European Search Report for application No. 20216325.9, dated Jun. 16, 2021.

\* cited by examiner

FET DEVICE AND A METHOD FOR FORMING A FET DEVICE

CROSS-REFERENCE TO RELATED APPLICATIONS

This application claims benefit of EPC Application No. 20216325.9 filed on Dec. 22, 2020, which is herein incorporated by reference in its entirety.

TECHNICAL FIELD

The present inventive concept relates to a field-effect transistor (FET) device and a method for forming a FET device.

BACKGROUND

Moore's law, that sets the footprint area of a transistor to scale by a factor 2, i.e. the transistor gate length L to scale by a factor √2, every 2 years, has been the driving force of the electronic industry, scaling the length of a transistor to its limits. Today, the minimal distance between the gate of two subsequent transistors, a measure known as contacted poly pitch (CPP) or gate pitch (CGP), has been scaled to approximately 50 nm. Device parameters limiting further CPP scaling include gate length, source/drain contact area and gate spacer width.

SUMMARY

An objective of the present inventive concept is to enable further CPP scaling. Additional and alternative objectives may be understood from the following.

According to an aspect of the present inventive concept there is provided a field-effect transistor, FET, device. The FET device comprises a source region comprising a common source body portion and a set of vertically spaced apart source layer prongs protruding from the common source body portion in a first lateral direction. First dielectric layer portions are arranged in spaces between the source layer prongs. The device further comprises a drain region comprising a common drain body portion and a set of vertically spaced apart drain layer prongs protruding from the common drain body portion in the first lateral direction. Second dielectric layer portions are arranged in spaces between the drain layer prongs. The device further comprises a gate body comprising a common gate body portion and a set of vertically spaced apart gate prongs protruding from the common gate body portion in a second lateral direction opposite the first lateral direction. Each gate prong is formed intermediate a respective pair of first and second dielectric layer portions. The device further comprises a channel region intermediate the source and drain regions and comprising a set of vertically spaced apart channel layer portions. Each channel layer portion extends between a respective pair of source and drain layer prongs. The channel layer portions are arranged in spaces between the gate prongs.

According to the inventive device aspect the common gate body portion may be offset laterally with respect to both the common source and drain body portions, while the gate prongs may be offset vertically with respect to the source and drain layer prongs. The gate body and source/drain regions may hence be provided without any mutual overlap. This allows use of thinner gate spacers or even omitting gate spacers altogether, that appears twice in the CPP of a conventional FET device.

The source and drain layer prongs protrude in an opposite lateral direction to the gate prongs. Accordingly, the common source and drain body portions, and the common gate body portion may be arranged at mutually opposite sides of a vertical geometrical plane extending through the source region, the channel region and the drain region (i.e. a lateral offset).

The channel layer portions extend between a respective pair of source and drain layer prongs and are arranged in spaces between the gate prongs. Meanwhile, each gate prong is formed intermediate a respective pair of first and second dielectric layer portions.

The gate prongs may hence be arranged at different levels than the source and layer drain layer prongs and the channel layer portions (i.e. a vertical offset). In other words, the device may comprise an alternating arrangement of first and second device levels, wherein a pair of dielectric layer portions and a gate prong is arranged in each first device level, and wherein a pair of source and drain layer prongs and a channel layer portion is arranged in each second device level.

As used herein, the term "lateral" is used to indicate an orientation or a direction in a horizontal plane, i.e. parallel to (a main plane of extension) of a substrate of the FET device.

The term "vertical" is used to indicate an orientation or a direction which is perpendicular to the lateral direction, i.e. perpendicular/normal to (main plane of extension of) a substrate of the FET device.

Accordingly, the channel layer portions may extend between the source and drain regions in a horizontal direction perpendicular to the first and second lateral/horizontal directions. This direction may also be referred to as a third lateral direction or a longitudinal direction of the channel layers (or shorter "channel direction").

The source and drain layer prongs may each comprise semiconductor material. The source and drain layer prongs may be epitaxial/epitaxially grown semiconductor source and drain layer prongs.

As used herein, the term "source/drain layer prong" refers to a portion (e.g. layer-shaped) of the source/drain body protruding laterally from the common source/drain body portion to a respective free end. The term "gate prong" correspondingly refers to a portion (e.g. layer-shaped) of the gate body protruding laterally from the common gate body portion to a respective free end.

According to embodiments, the common source body portion and the common drain body portion may each comprise semiconductor material. The common source body portion may be an epitaxial/epitaxially grown semiconductor body portion. The common drain body portion may be an epitaxial/epitaxially grown semiconductor body portion.

According to embodiments, the common source body portion and the common drain body portion may alternatively each comprise metal. The common source body portion and the common drain body portion may each be a metal body portion.

The common source and drain body portions may in either case merge the source and drain layer prongs, respectively.

The common source and drain body portions may form wrap-around contacts.

According to embodiments, a distance, along the second lateral direction, between the common gate body portion and the common source body portion and common drain body portion may correspond to at least a length of each one of the gate prongs and each one of the source and drain layer prongs. In other words, a lateral/horizontal distance along the second lateral direction between the common gate body and the common source and drain body portions may meet or exceed a length of the gate prongs and source/drain layer prongs. This ensures there is no lateral overlap between the gate prongs and common source and drain body portions, on the one hand, and on the other hand no lateral overlap between the source and drain layer prongs and the common gate body portion.

According to embodiments, the common source body portion and the common drain body portion may each comprise a wide portion and a narrow portion arranged intermediate the wide portion and the source and drain layer prongs, respectively, wherein a transverse (horizontal) dimension of the wide portion exceeds a transverse (horizontal) dimension of the narrow portion. The term "transverse dimension" hereby refers to a width dimension of the common source/drain body portions, i.e. along a channel direction. The common source and drain body portions may hence be increased in width, in a region remote from the line of sight of the channel layer portions. This may facilitate contacting the source and drain bodies, and allow a reduced source/drain access resistance. The respective wide portions are allowed owing to the aforementioned mutually opposite arrangement of the common source/drain body portions and the common gate body portion. The wide portions of the common source and drain body portions may be of such respective width dimensions that a distance between the wide portions is less than a width dimension of the gate body (i.e. also along the channel direction).

According to a further aspect there is provided an arrangement of a first and a second FET device, each FET device having a design according to the above described FET device. The first and second FET device may be arranged beside each other (e.g. on a substrate). The gate body of the first FET device and the gate body of the second FET may share a common gate body portion arranged intermediate the channel region of the first FET and the channel region of the second FET. The gate prongs of the first FET and second FET may protrude from the shared common gate body portion in opposite lateral directions.

This enables two FET devices to be combined in an area efficient manner with a shared-gate configuration. This configuration may be useful for combining FET devices of complementary channel types, i.e. for forming CMOS-devices. Accordingly, the first FET device may be an n-type FET and the second FET device may be a p-type FET.

According to a further aspect of the present inventive concept, there is provided a method for forming a FET device. The method comprises forming a fin structure comprising a stack of dielectric layers and channel layers alternating the dielectric layers. The method comprises forming a source trench and a drain trench beside the fin structure at a first side thereof, the source trench and the drain trench exposing a respective sidewall portion of the fin structure. The method comprises etching the channel layers from the source trench to remove a portion of each channel layer within a first region and etching the channel layers from the drain trench to remove a portion of each channel layer within a second region, thereby forming a set of source cavities in the first region and a set of drain cavities in the second region, wherein a set of channel layer portions remain in a third region intermediate the first and the second region. The method comprises: epitaxially growing a source material in the source cavities to form a source layer prong within each source cavity, in contact with an end of a respective channel layer portion exposed in the source cavity, and forming a common source body portion in the source trench; and epitaxially growing a drain material in the drain cavities to form a drain layer prong within each drain cavity, in contact with an end of a respective channel layer portion exposed in the drain cavity, and forming a common drain body portion in the drain trench.

The method further comprises forming a gate trench beside the set of channel layer portions, the gate trench exposing respective sidewall portions of the set of channel layer portions and the dielectric layers along the third region. The dielectric layers are etched from the gate trench to remove a portion of each dielectric layer within the third region, thereby forming a set of gate cavities in the third region. A gate body is formed comprising a set of gate prongs in the gate cavities and a common gate portion in the gate trench.

This method allows forming of FET device offering the advantages discussed in connection with the device aspect above.

Forming the source and drain trenches beside the fin structure at the first side, and the gate trench beside the fin structure at the second opposite side, facilitates forming the common source and drain body portions and the gate body portion on opposite sides. That is, the source and drain trenches may be formed selectively/only at the first side of the fin structure and the gate trench may be formed selectively/only at the second side of the fin structure.

The source and drain trenches allow the channel layers to be accessed and selectively etched. The channel layers may thus be removed within the first and second regions, respectively, selectively to the dielectric layers. The source material may then be epitaxially grown to form the source layer prongs, vertically spaced apart by the dielectric layer (portions) remaining in the first region. Correspondingly, the drain material may be epitaxially grown to form the drain layer prongs, vertically spaced apart by the dielectric layer (portions) remaining in the second region.

The etching of the channel layers may comprise laterally etching back the channel layers from the source and drain trenches. The channel layers may be laterally etched back such that the source and drain cavities extend completely through the fin structure (i.e. from the first side to the second side of the fin structure). The channel layers may be etched using an isotropic etching process. This may facilitate a lateral etch back.

The gate trench allows the dielectric layers to be accessed and selectively etched. The dielectric layers may thus be removed within the third region, selectively to the channel layer portions. Gate cavities exposing upper and lower surfaces of the set of channel layer portions may thus be formed.

The etching of the dielectric layers may comprise laterally etching back the dielectric layers from the gate trench. The dielectric layers may be laterally etched back such that the gate cavities extend completely through the fin structure (i.e. from the second side to the first side of the fin structure). The dielectric layers may be etched using an isotropic etching process. This may facilitate a lateral etch back.

It should be understood that the expression "forming a trench" implies forming a hole in a material deposited beside the fin structure (at the first side when referring to the source and drain trenches, or at the second side when referring to the gate trench).

The fin structure may be surrounded by insulating material. The source and drain trenches may be formed in the insulating material at the first side of the fin structure. The gate trench may be formed in the insulating material at the second side of the fin structure.

The channel layers may be formed of a Si-comprising material. The channel layers may be formed by Si-layers or SiGe layers.

The dielectric layers may comprise an oxide or a nitride material. The dielectric layers may be formed of a SiGeOx, SiO2, SiN or (low-k) SiCO.

According to embodiments, forming the common source body portion and the common drain body portion may comprise further growing the source and drain material on the source and drain layer prongs, respectively, such that the source material merges in the source trench and the drain material merges in the drain trench. The common source and drain body portions may hence be formed as merged epitaxial semiconductor bodies.

According to embodiments, forming the common source body portion and the common drain body portion may alternatively comprise depositing a metal in the source trench and the drain trench in contact with the source and drain layer prongs, respectively. The epitaxial growth of the source and drain material may hence be stopped prior to merging of the source layer prongs and merging of the drain layer prongs. A respective common body portion may then be provided by depositing a metal in the source and drain trench, respectively.

According to embodiments, the method may further comprise, prior to forming the source and drain trench, subjecting the fin structure to an ion implantation process in the first region and second region while masking the fin structure in the third region. Thereby, dopants may be selectively introduced into the channel layers and the dielectric layers in the first and the second regions. Etch rates may depend on doping levels of the materials exposed to the etchants. Accordingly, the ion implantation process allows introducing variable etch properties along the length of the fin structure.

After the ion implantation process the channel layers may thus have an increased concentration of dopants in the first and the second regions compared to channel layers in the third region. Correspondingly, the dielectric layers may have an increased concentration of dopants in the first and second regions compared to the dielectric layers in the third region.

Etching the channel layers from the source and drain trenches may comprise selectively etching doped portions of the channel layers in the first and second regions. Hence, the doped portions may be etched at a greater rate than the dielectric layers in the first and second regions, and at a greater rate than the channel layer portions in the third region (i.e. having a lower doping concentration).

Etching the dielectric layers from the gate trench may comprise selectively etching masked portions of the dielectric layers in the third region (i.e. portions of the dielectric layers masked during the ion implantation process). Hence, the masked portions of the dielectric layers (i.e. having a lower doping concentration) may be etched at a greater rate than the dielectric layers in the first and second regions, and at a greater rate than the channel layer portions in the third region (i.e. having a lower doping concentration).

According to embodiments, the method may further comprise forming a preliminary fin structure comprising a stack of process layers and channel layers alternating the process layers, wherein the process layers are formed of a different semiconductor material than the channel layers and the method comprises selectively removing the process layers to form gaps in the preliminary fin structure and filling the gaps with a dielectric material to form dielectric layers. This allows forming of a preliminary fin structure comprising a stack of semiconductor layers, advantageously as epitaxial layers, using state of the art nanosheet FET process technology, and subsequently convert the semiconductor material of the process layers into dielectric material, to provide an increased etch selectivity for subsequent process steps.

The channel layers and the process layers may be formed of different Si-comprising material. The process layers may be formed of a Si-comprising material with a greater Ge-content than the channel layers. The dielectric material may be an oxide or a nitride material. The dielectric layers may be formed of a SiGeOx, $SiO_2$, SiN or (low-k) SiCO.

According to embodiments, the method may further comprise forming a preliminary fin structure comprising a stack of process layers and channel layers alternating the process layers, wherein the process layers are formed of a different semiconductor material than the channel layers and the method comprises converting the process layers into dielectric layers in an oxidation process. The material of the process layers may hence be selectively converted/oxidized to form layers of a dielectric (oxide) material. This provides similar advantages to those described above, however is less reliant on the presence of a supporting structure to ensure structural stability of the fin structure.

The channel layers and the process layers may be formed of different Si-comprising material. The process layers may be formed of a Si-comprising material with a greater Ge-content than the channel layers. A greater Ge-content may increase a rate of oxidation, hence allowing a selective conversion of the process layers into a SiGeOx, without affecting the (lower or zero Ge-content) channel layers substantially.

According to embodiments, a first, second and third mask feature may be formed respectively over the first, second and third regions of the fin structure, the second mask feature being of a different material than the first and third mask features. The different material may provide the second mask feature and the first/third mask features with different etch properties, hence enabling a selective opening of the mask features.

Accordingly, the method may comprise:

opening the first and second mask features selectively to the third mask feature, over the first side of the fin structure, and etching the source and drain trench from the respective opening in the first and second mask feature.

The method may further comprise:

opening the third mask feature selectively to the first and second mask features, over the second side of the fin structure, and etching the gate trench from the opening in the third mask feature.

The openings may be formed using lithography and etching.

The fin structure may comprise a capping layer on top of the stack of dielectric layers and channel layers, wherein forming each one of the source, drain and gate trench comprises using the capping layer as an etch mask. This facilitates forming the source/drain/gate trenches alongside the sides of the fin structure without causing undesired etching of the fin structure.

The openings in the first and third mask features may for example be formed to overlay part of the capping layer (from the first side) wherein the source and drain trenches may be self-aligned with respect to the first side of the fin structure. Correspondingly, the opening in the second mask feature may be formed to overlay the capping layer (from the second side) wherein the gate trench may be self-aligned with respect to the first side of the fin structure.

BRIEF DESCRIPTION OF THE DRAWINGS

The above, as well as additional objects, features and advantages of the present inventive concept, will be better understood through the following illustrative and non-limiting detailed description, with reference to the appended drawings. In the drawings like reference numerals will be used for like elements unless stated otherwise.

DETAILED DESCRIPTION

Figure 1:
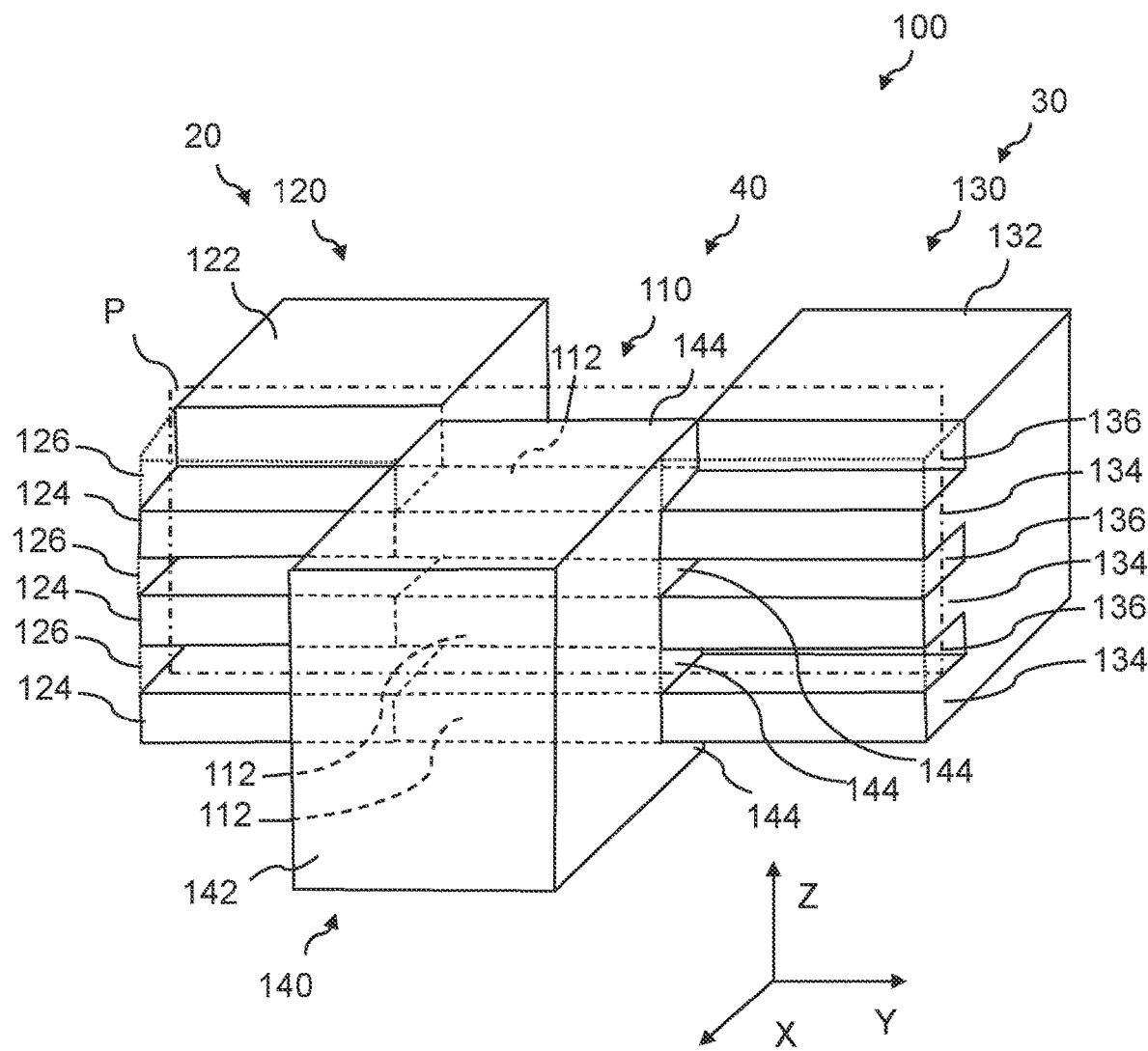
FIG. 1 is a perspective view of a FET device according to an embodiment.

FIG. 1 shows in a schematic perspective view a FET device 100 according to an embodiment. In the FIG. 1 and subsequent figures, axis X indicates a first horizontal direction, Y indicates a second horizontal direction perpendicular to X, and Z indicates a vertical direction.

The FET device 100 comprises a source region 20, a drain region 30, and a channel region 40 being intermediate the source region 120 and the drain region 130.

The source region 20 comprises a common source body portion 122 and a set of vertically spaced apart source layer prongs 124. The source layer prongs 124 protrude from the common source body portion 122 in a first lateral direction, i.e. along the X direction. The common source body portion 122 and the source layer prongs 124 together define a source body 120.

The drain region 30 comprises a common drain body portion 132 and a set of vertically spaced apart drain layer prongs 134. The drain layer prongs 134 protrude from the common drain body portion 132 in the first lateral direction, i.e. along the X direction. The common drain body portion 132 and the drain layer prongs 134 together define a drain body 130.

The channel region 40 comprises a set of vertically spaced apart channel layer portions 112. Each channel layer portion 112 extends horizontally (along the second horizontal direction Y) between a respective pair of source and drain layer prongs 124, 134.

The source and drain layer prongs 124, 134 and the channel layer portions 112 may each be formed with a nanosheet-shape. A nanosheet may by way of example have a width (along the X direction) in a range from 7 nm to 30 nm and a thickness (along the Z direction) in a range from 2 nm to 10 nm.

The device 100 further comprises a gate body 140 comprising a common gate body portion 142 and a set of vertically spaced apart gate prongs 144. The gate prongs 144 protrude from the common gate body portion 142 in a second lateral direction opposite the first lateral direction, i.e. against the X direction. The gate prongs 144 extend to overlap the channel layer portions 112 in the channel region 40. The channel layer portions 112 are arranged in spaces between the gate prongs 144.

First and second dielectric layer portions 126, 136 are arranged in (vertical) spaces between the source and drain layer prongs 124, 134, respectively. Each gate prong 144 is formed (horizontally) intermediate a respective pair of first and second dielectric layer portions 126, 136.

The device 100 may accordingly comprise an alternating sequence of source layer prongs 124 and first dielectric layer portions 126 in the source region, an alternating sequence of drain layer prongs 134 and second dielectric layer portions 136 in the drain region, and an alternating sequence of gate prongs 144 and channel layer portions 112 in the channel region.

Each channel layer portion 112 may be level with the respective pair of source and drain layer prongs 124, 134. Meanwhile, each gate prong 144 may be level with the respective pair of first and second dielectric layer portions 126, 136. The gate prongs 144 may hence be offset vertically with respect to the source and drain layer prongs 124, 134. In other words, the device 100 may comprise an alternating arrangement of first and second device levels, wherein a pair of dielectric layer portions 126, 136 and a gate prong 144 is arranged in each first device level, and a pair of source and drain layer prongs 124, 134 and a channel layer portion 112 is arranged in each second device level.

As shown in FIG. 1, the common source and drain body portions 122, 132 and the common gate body portion 142 may be arranged at mutually opposite sides of a geometrical plane P, wherein the plane P is defined to extend through the source region, the channel region and the drain region. This design, combined with the afore-mentioned vertical offset between the gate prongs 144 and the source and drain layer prongs 124, 134, allow a mutual overlap between the source/drain bodies 120, 130 and the gate body 140 to be minimized. The need for an insulating gate spacer to ensure reliable electrical and capacitive separation between the gate body 140 and each one of the source and drain bodies 120, 130 is hence reduced.

In the illustrated embodiment, a horizontal distance along the second lateral direction (against the X direction) between the common gate body 142 and each one of the common source and drain body portions 122, 134 meet or exceed a respective length of the gate prongs 144 and source/drain layer prongs 122, 132. Lateral overlap, as seen along the line of sight of the channel layer portions 112, between the gate prongs 144 and the common source and drain body portions 122, 132, and between the source and drain layer prongs 124, 134 and the common gate body portion 142 may thus be minimized. This obviates the need for a conventional gate spacer.

The channel layer portions 112 may be formed of a semiconductor, such as a Si-comprising semiconductor. The channel layer portions 112 may for example be formed Si or SiGe layers. These materials are however only examples and it is contemplated that also other semiconductors may be used, such as Ge.

The source and drain layer prongs 124, 134 may each comprise semiconductor material. The source and drain layer prongs 124, 134 may be epitaxial semiconductor source and drain layer prongs 124, 134. The source and drain layer prongs 124, 134 may for example be formed of Si or SiGe, on Si or SiGe channel layer portions 112. The source and drain layer prongs 124, 134 (and the common source and drain bodies 124, 132 if formed by semiconductor material) may be doped with n-type or p-type dopants, in accordance with the conductivity type of the device 100.

The dielectric layer portions 126, 136 may comprise an oxide or a nitride material. The dielectric layers may be formed of a $SiGeOx$, $SiO_2$, SiN or (low-k) SiCO.

The common source body portion 122 and the common drain body portion 132 may each comprise semiconductor material. The common source and drain body portions 122, 132 may be formed as respective epitaxial semiconductor body portions, e.g. of a same material as the source and drain layer prongs 124, 134. As will be further described herein, the common source and drain body portions 122, 132 may be formed respectively by epitaxially growing source/drain material to form the source and drain layer prongs 124, 134 and continuing the epitaxy such that the source/drain material merges to form the respective common source and drain body portions 122, 132.

The common source and drain body portions 122, 132 may alternatively be formed as metal-comprising body portions, in contact with and merging the source and drain layer prongs 124, 134, respectively. The body portions 122, 132 may for example be formed of W, Al, Ru, Mo or Co. The body portions 122, 132 may further comprise a barrier metal layer, e.g. Ta or TaN. The common source and drain body portions 122, 132 may be formed as wrap-around contacts, i.e. wrapping around ends of the source and drain layer prongs 124, 134, respectively.

FIG. 2 shows in a FET device 200 according to a further embodiment. FIG. 2 shows the FET device 200 in a number of schematic plane views, wherein FIG. 2a is a top-down view, FIG. 2b represents a cross-section along the vertical plane C-C, FIG. 2a represents a cross-section along the vertical plane A-A and FIG. 2d represents a cross-section along the vertical plane B-B. FIG. 2b hence shows the device 200 along a plane corresponding to the plane P in FIG. 1, FIG. 2c shows a cross-section of the device 200 in the channel region 40, while FIG. 2c shows a cross-section of the device 200 in the drain region 30. In the illustrated embodiment, the device 200 has a similar appearance in the source and drain regions 20, 30 and FIG. 2c is hence representative also of the source region 20 (replacing reference signs 130, 134, 136 with 120, 124, 126, respectively).

The FET device 200 generally comprises features corresponding to those of the device 100, wherein like reference signs in FIG. 1 and FIG. 2 are used to denote like features. Undue repetition of these correspondingly numbered features will hence be avoided.

Figure 2A:
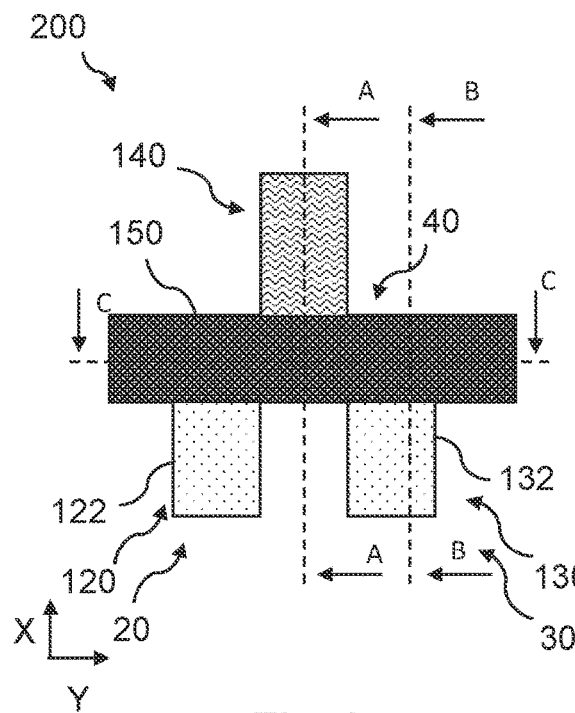
FIG. 2a-d shows in plane views a FET device according to a further embodiment.
Figure 2B:
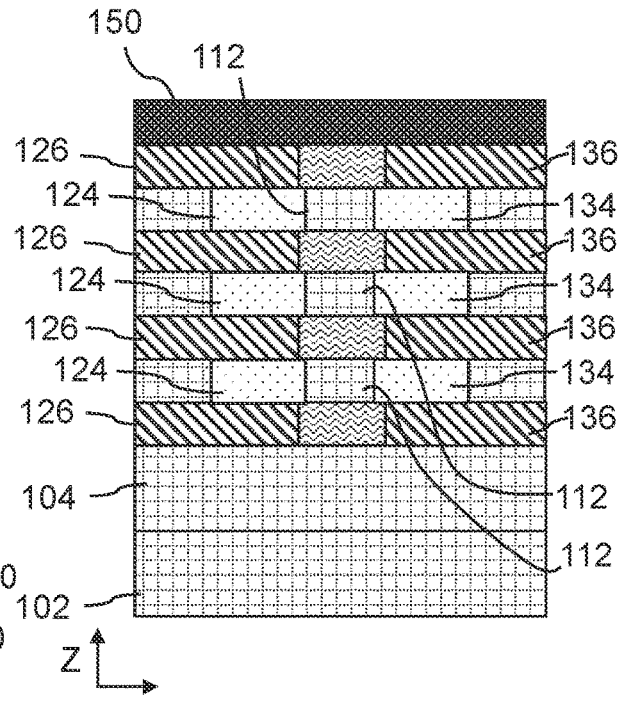
Figure 2C:
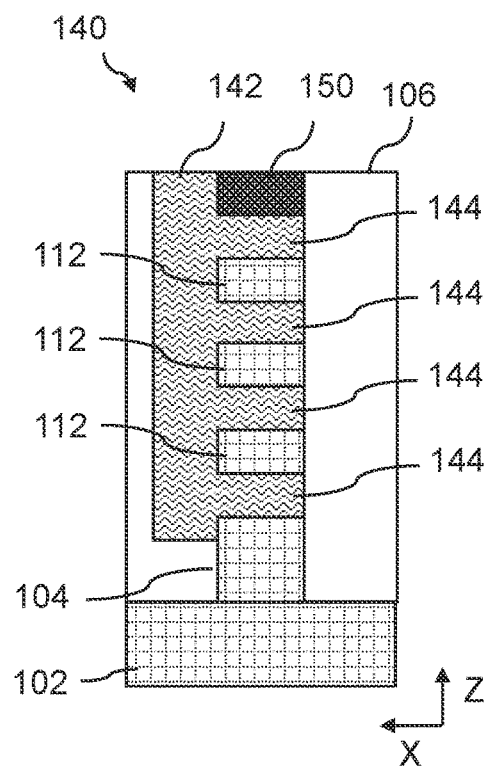
Figure 2D:
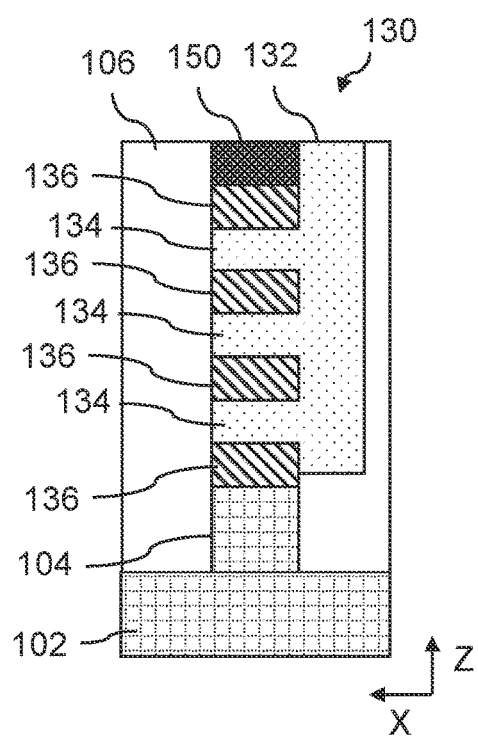
Figure 3A:
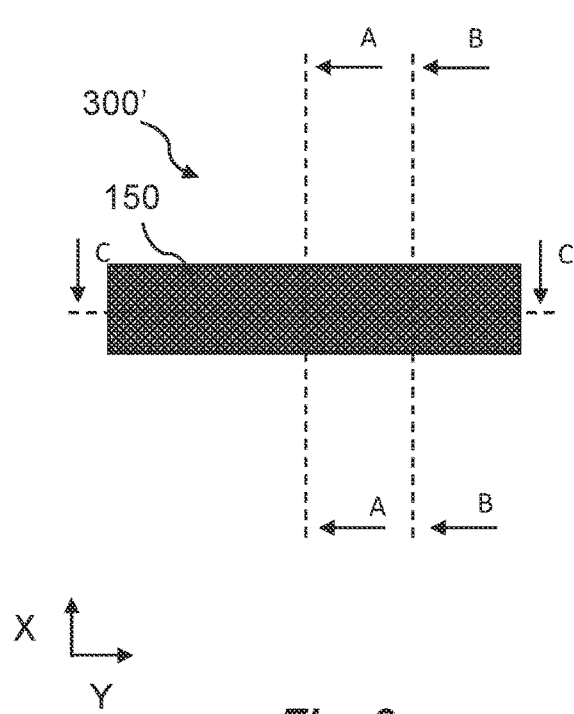
FIG. 3a-d through 10a-d illustrate method steps for forming a FET device according to an embodiment.
Figure 3B:
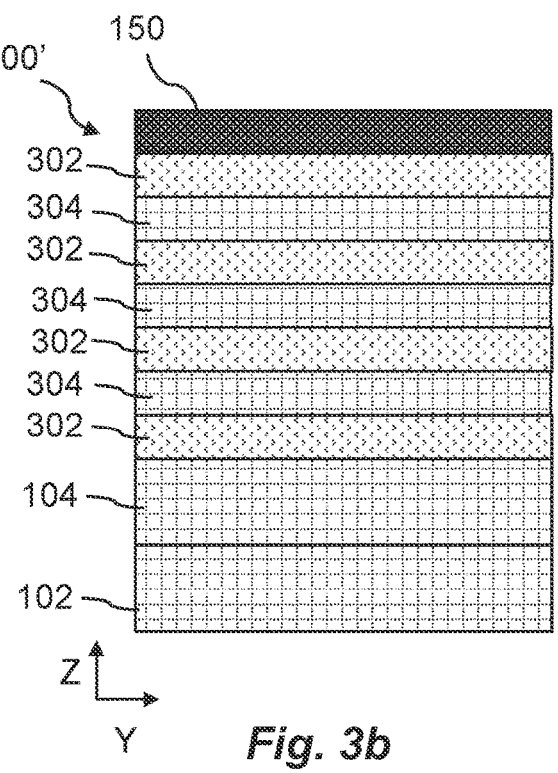
Figure 3C:
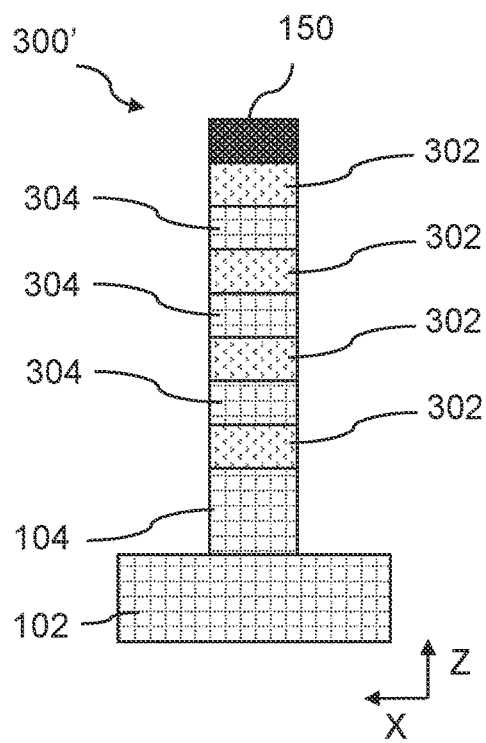
Figure 3D:
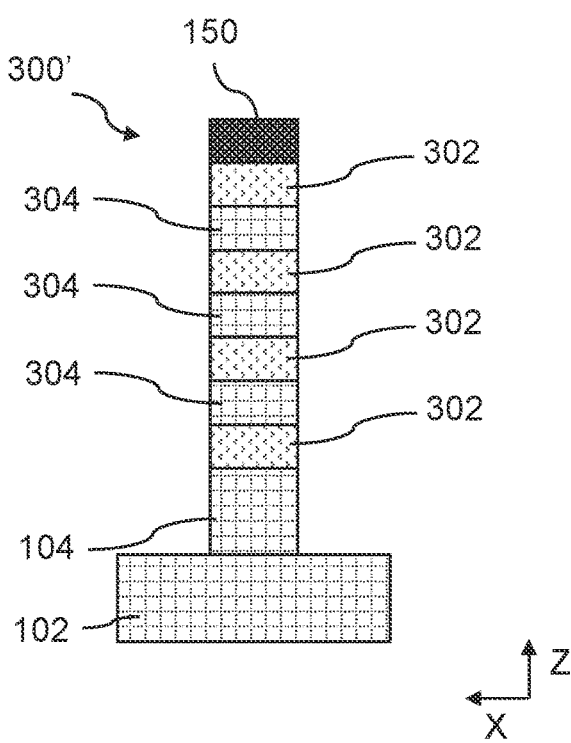

As shown in FIGS. 2b-d, the device 200 may be supported by a substrate 102. The substrate 102 may be a semiconductor substrate, i.e. a substrate comprising at least one semiconductor layer, e.g. of Si, SiGe or Ge. The substrate 102 may be a single-layered semiconductor substrate, for instance formed by a bulk substrate. A multi-layered/composite substrate 102 is however also possible, an epitaxially grown semiconductor layer on a bulk substrate, or a semiconductor-on-insulator (SOI) substrate.

The channel layer portions 112, the gate prongs 144, the source layer prongs 124, the drain layer prongs 134 and the first/second dielectric layer portions 126, 136 (i.e. the "device layer stack") may be arranged in a generally fin-shaped structure, extending horizontally along the substrate 102. The fin-shaped structure may comprise a (fin-shaped) base portion 104 protruding from the substrate 102. The base portion 104 may as indicated by the similar fill pattern, for example be of a same material as the substrate 102.

The device layer stack and the common source, drain and gate body portions 120, 130, 140 may as shown be arranged in an insulating layer 106. The insulating layer 106 may surround the device 200, on either sides. The insulating layer 106 may be formed by an oxide material such as $SiO_2$, a flowable-CVD oxide, or some other conventional insulating (low-k) material.

The device 200 may as further shown comprise a capping layer 150, on top of the device layer stack. The capping layer 150 may be formed of a hardmask material such as an oxide or nitride hardmask. The capping layer 150 may be remnant from a fabrication process wherein the capping layer 150 may be used as a hardmask during fin patterning.

Although shown as a single piece of material in FIGS. 1 and 2, it should be noted that the gate body 120 may comprise two or more layers, such as at least a gate dielectric layer conforming to channel layer portions 112, and one or more gate electrode material layers formed sequentially on the gate dielectric layer, such as one or or more gate work function metal (WFM) layers and a gate electrode fill layer. The gate dielectric layer may be a conventional gate dielectric of a high-k, such as $HfO_2$, LaO, AlO and ZrO. Examples of gate WFM material include conventional n-type and p-type effect WFM metals, such as TiN, TaN, TiAl, TiAlC or WCN, or combinations thereof. Examples of gate fill material gate include W and Al.

FIG. 3a-d through 10a-d illustrate method steps for forming a FET device, such as the device 100 or 200, according to an embodiment. The views of the following figures generally correspond to those of FIGS. 2a-d, unless stated otherwise.

FIGS. 3a-d show a preliminary fin structure 300' comprising a stack of process layers 302 and channel layers 304 alternating the process layers 302. FIGS. 4a-d show a fin structure 300 comprising dielectric layers 306 in place of the process layers 302 following a "conversion step" applied to the preliminary fin structure 300'. The fin structure 300 thus comprises a stack of alternating dielectric layers 306 and channel layers 304. The layers 302, 304, 306 may be formed as nanosheets.

To facilitate selective processing, the process layers 302 of the preliminary fin structure 300' are formed of a different semiconductor material than the channel layers 304. In the present embodiment, it will be assumed that the channel layers 304 are Si-layers and that the process layers 302 are SiGe layers with a Ge-content of 25% or greater. However, the method has a more general applicability and the layers 302 and 304 may be formed of any combination of semiconductors compatible with the subsequent method steps to be described. For example, both the process layers 302 and the channel layers 304 may be formed of SiGe, but with a different relative Ge-content, such as $SiGe_{0.75}$ process layers 302 and $SiGe_{0.15}$ channel layers 304, $SiGe_{0.15}$ process layers 302 and $SiGe_{0.75}$ channel layers 304, or $SiGe_{0.5}$ process layers 302 and Ge channel layers 304, as non-limiting examples.

The stack of process layers 302 and channel layers 304 may be formed by alternatingly epitaxially growing process layers 302 and channel layers 304 on top of each other, for example by physical vapor deposition (PVD) or chemical vapor deposition (CVD).

The stack of layers 302, 304 may be formed on an upper layer or thickness portion 104 of a substrate 102 (e.g. of Si) and be patterned into a fin-shaped structure 300'. The fin-patterning may proceed in a manner per se known in the art, e.g. by patterning trenches in the stack of layers 302, 304 using single- or multiple-patterning techniques using e.g. a patterned hardmask as an etch mask. The etching may extend into the substrate such that upper layer/thickness portion 104 form part of the fin 300' (e.g. a base portion 104 of the fin 300'). Portions of the patterned hardmask may remain on top of the stack of layers as a capping layer 150 of the fin preliminary structure 300' (and the fin structure 300).

The method may proceed with "converting" the preliminary fin structure 300' into the fin structure 300 of FIG. 4, by replacing the process layers 302 by dielectric layers 306.

According to a first conversion approach, the fin structure 300 may be formed by removing the process layers 302 of the preliminary fin structure 300' by selective etching to form gaps and thereafter fill the gaps with a dielectric material to form the dielectric layers 306. For example, SiGe process layers 302 may be removed selectively to Si channel layers 304 using an HCl-based dry etch. However, other etching processes (e.g. wet etching processes) allowing selective etching of SiGe with respect to Si are per se known in the art and may also be employed for this purpose.

The dielectric material may be an oxide or a nitride material, such as $SiO_2$, SiN or (low-k) SiCO. The dielectric material may be conformally deposited, e.g. using atomic layer deposition (ALD), such that the gaps are completely filled with the dielectric material. The deposition may be followed by an etch step (wet or dry, isotropic or anisotropic top-down) to remove dielectric material deposited outside the gaps such that the dielectric material remains in the gaps to form the dielectric layers 306.

Prior to removing the process layers 302, a supporting structure in the form of an insulating layer (such as an STI oxide) embedding the preliminary fin structure 300' may be deposited. The insulating layer may be etched back at one side of the preliminary fin structure 300' to expose a sidewall thereof, thus allowing the process layers 302 to be exposed for etching from a side of the preliminary fin structure 300'. The insulating layer may be re-deposited and etched-back/planarized after forming the dielectric layers 306. An alternative to an insulating layer may be to form one or more (fin-shaped) sacrificial structures (e.g. of a-Si) extending across and straddling the preliminary fin structure. The sacrificial structure may thus "tether" and "suspend" the channel layers 304 when the process layers 302 are removed. The sacrificial structure may be removed from the fin structure 300 after forming the dielectric layers 306 between the channel layers 304.

According to a second conversion approach, the process layers 302 may instead be selectively converted into dielectric layers 306 in an oxidation process. The oxidation process may for example be a thermal oxidation process. The higher Ge-content of the SiGe process layers 302 allows the process layers 302 to be oxidized at a greater rate than the (lower Ge-content) Si channel layers 304. The process layers 302 may hence be fully oxidized and converted into SiGeOx dielectric layers 306 without affecting the channel layers 304 substantially. For sake of completeness, it may be noted that the oxidation process may result in formation of a thin residual oxide layer (e.g. $SiO_2$) on an outer surface of the channel layers 304, which however may be removed with a short oxide step before proceeding with the further method steps.

FIGS. 4a-d accordingly shows the resulting/final fin structure 300 following either of the above-described "conversion steps". Insulating material may be deposited to form an insulating layer 106 surrounding the fin structure 300 on either side. Reference signs 20, 30 and 40 indicate a "first", "second" and "third" region, corresponding respectively to regions in which the source, drain and channel regions of the device 200 will form. Like numbers are hence used for the first, second and third regions and the source, drain and channel regions.

Converting/replacing the process layers 302 with dielectric layers 306 enables providing an increased etch selectivity between the layers of the fin structure 300, to facilitate subsequent process steps. To facilitate a selective processing also along the length of the fin structure 300 (along the Y direction) the fin structure 300 may further optionally be subjected to an ion implantation process such that the channel layers 304 and the dielectric layers 306 may be formed with an increased concentration of dopants in the first and the second regions 20, 30 compared to the third region 40. This may be achieved by subjecting the fin structure 300 to an ion implantation process in the regions 20, 30 while masking the fin structure 300 in the third region 40. As etch rates may depend on doping levels of the materials exposed to the etchants, the ion implantation process allows introducing variable etch properties along the length of the fin structure 300.

Figure 4A:
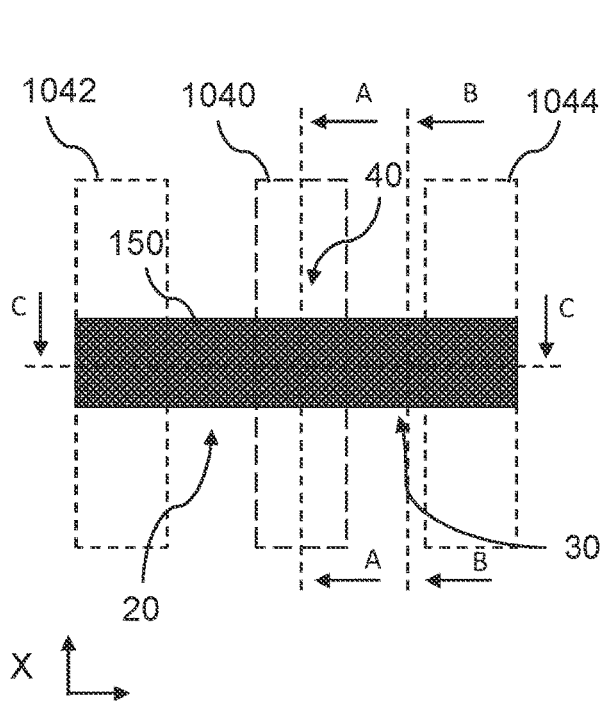
Figure 4B:
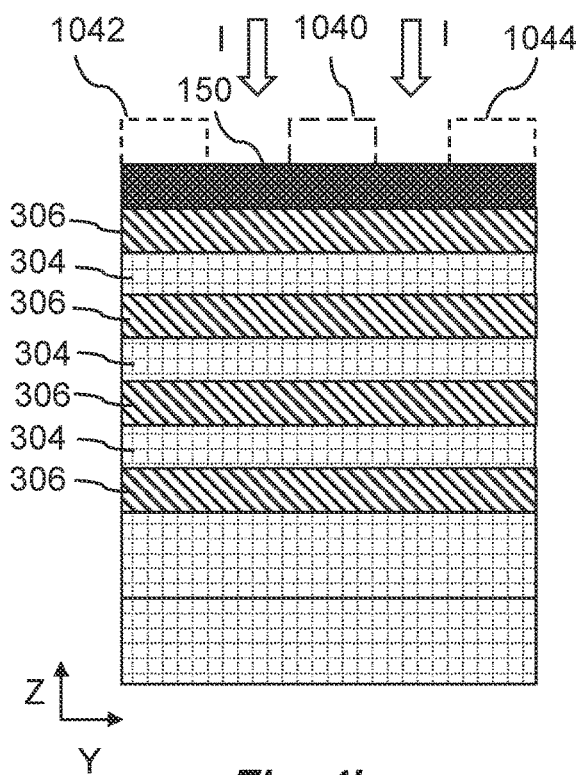
Figure 4C:
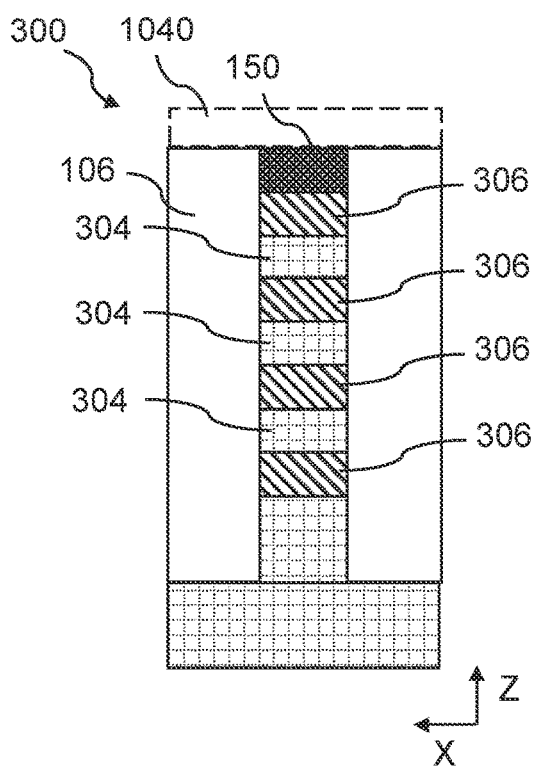
Figure 4D:
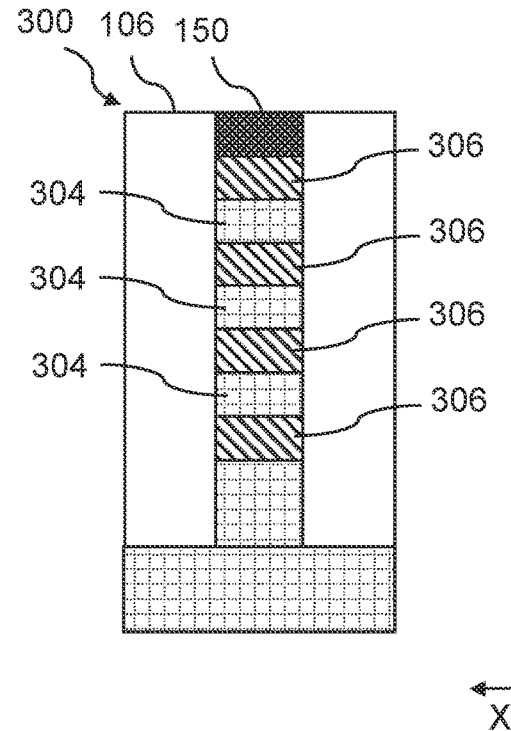

The arrows "I" in FIG. 4a schematically indicates the ion implantation process. The dashed line box 104 indicates a mask/mask feature 1040 which may be used as an implantation mask. The mask feature 1040 may be formed by a material or combination of materials such that it may withstand the ion bombardment and thus counteract implantation of the fin structure 300 in the third region 40. The ion acceleration may as indicated in FIG. 4a be biased in a top-down direction (negative Z direction) such that the portion of the fin structure 300 directly underneath the mask feature 1040 is masked, while the adjacent non-masked portions are implanted. One non-limiting example of dopant is $GeH_4$, however more generally any type of ion implant affecting the etch rate in the intended manner may be used.

One or more layers of a hardmask material, for example a nitride-comprising hardmask such as SiN, or TiN, or a-Si or a dielectric hardmask material may be used for the mask feature 1040. The mask feature 1040 may be formed by patterning a hardmask layer using conventional single- or multi-patterning techniques. As further shown in FIG. 4a, a number of parallel mask features 1042, 1044 may optionally be formed across the fin structure 300. The fin structure 300 may hence be masked in additional regions, which may be useful e.g. for forming a number of similar devices 200 along the length of a same fin structure 300.

In FIGS. 5a-d, a source trench 308 and a drain trench 310 have been formed in the insulating material 106 beside the fin structure 300, at a first side thereof. The source and drain trenches 308, 310 expose a respective sidewall portion of the fin structure 300. Hence, the source and drain trenches 308, 310 may each expose respective portions of the dielectric layers 306 and the channel layers 304 from the first side of the fin structure 300.

As indicated in the figures, the source and drain trenches 308, 310 may be formed selectively at the first side of the fin structure 300 to expose only sidewall portions of fin structure 300 facing the first side, while the directly opposite sidewall portions remain covered by the insulating material 106.

Forming the source and drain trenches 308, 310 may comprise etching the insulating layer 106 through respective openings in an etch mask. As shown in FIGS. 5a-d, the mask feature 1040 may be supplemented by mask features 1020, 1030 (dotted outline), at opposite sides of the first mask feature 1040 (dashed outline), e.g. in the gaps between the mask features 1040, 1042 and 1040, 1044. The mask features 1020, 1030 be formed respectively in the first and second regions 20, 30 over the fin structure 300. The mask features 1020, 1030, 1040 may be correspondingly referred to as first through third mask features, respectively.

The first and second mask features 1020, 1030 may be of a different material than the third mask feature 1040, to enable selective opening of the mask features. A nitride-comprising third mask feature 1040 may for example be supplemented with first and second mask features 1020, 1030 of a-Si, SOC, or SiOC. The first and second mask features 1020, 1030 may for example be formed by etching back mask material deposited (e.g. conformally by ALD or non-conformally by CVD or spin-on deposition) to cover and fill gaps between the third mask features 1040, 1042, 1044, to (again) expose the third mask features 1040, 1042, 1044 with the first and second mask features 1020, 1030 formed of the mask material remaining in between.

The first and second mask features 1020, 1030 may then be opened selectively to the third mask feature 1040, over the first side of the fin structure 300, employing an etch selective to the material of the mask features 1020, 1030 (e.g. etching a-Si, SOC or SiOC at a greater rate than SiN or TiN).

The first and second mask features 1020, 1030 may be opened using lithography and etching. The source and drain trenches 308, 310 may then be etched in the insulating material 106 through the thus formed openings in the first and second mask features 20, 30.

Figure 5A:
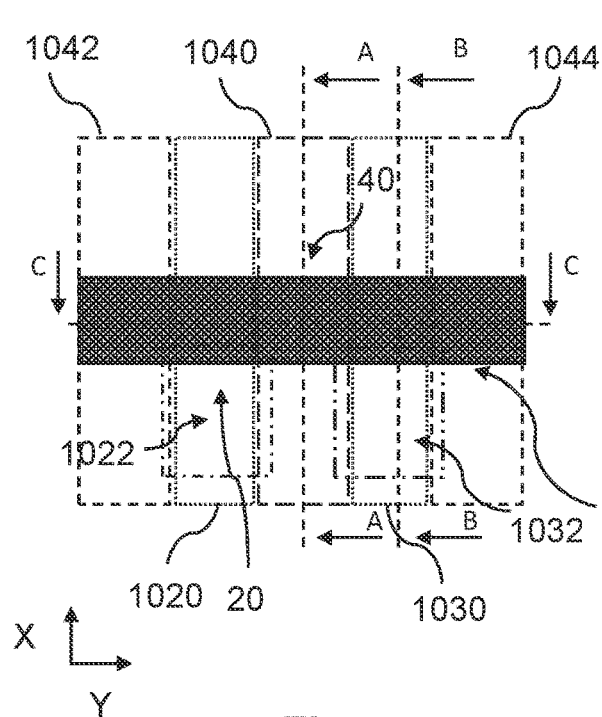
Figure 5B:
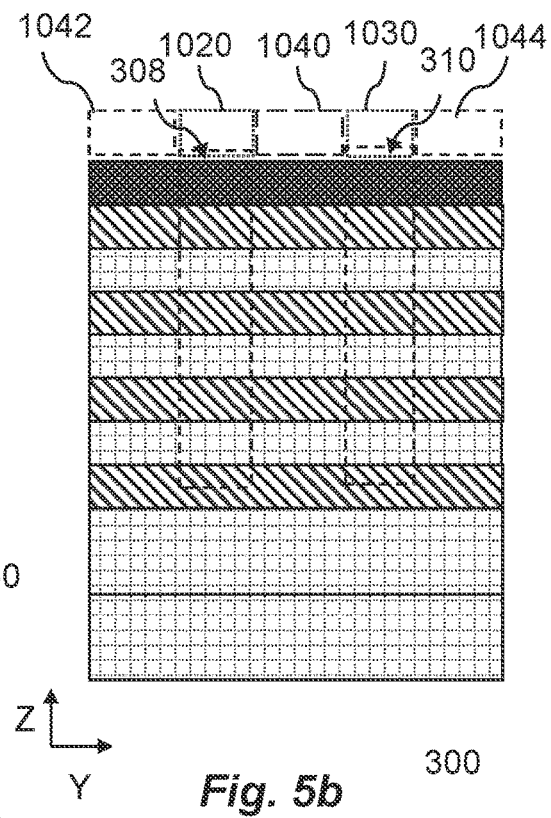
Figure 5C:
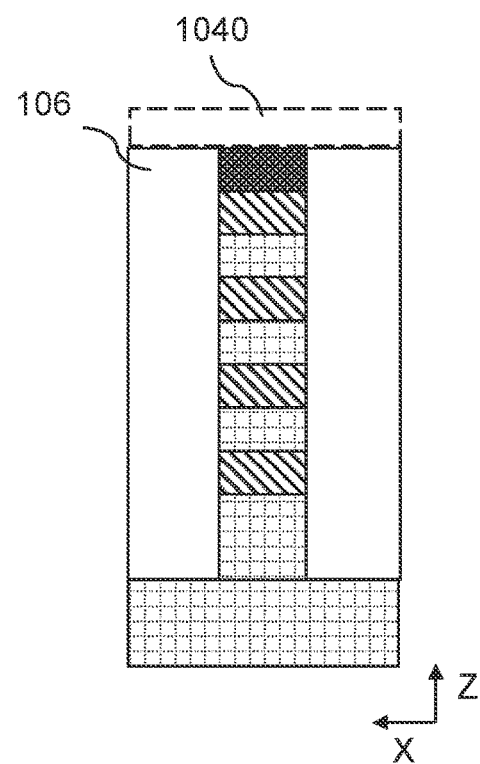
Figure 5D:
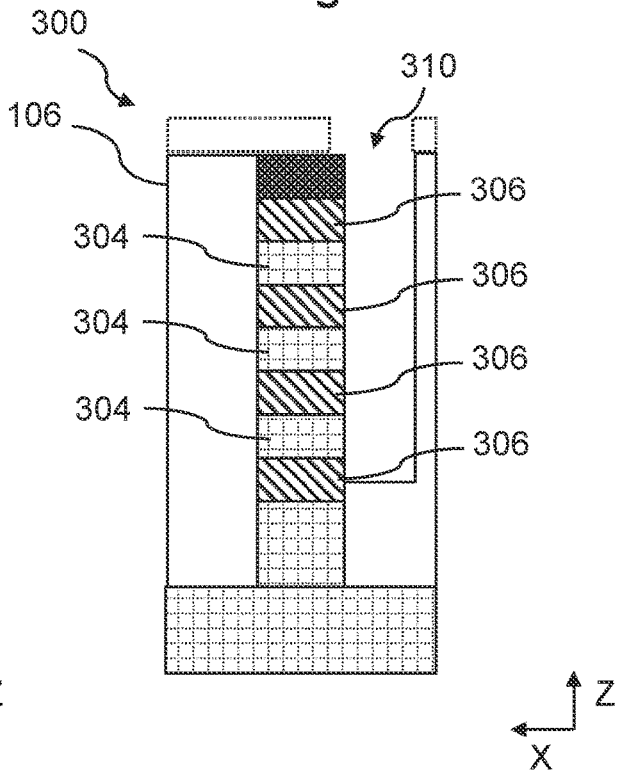

By virtue of forming the first and second mask features 1020, 1030 of a different material than the third mask feature(s) 1040, first and second mask features 1020, 1030 may be opened using an etch mask with openings of relaxed critical dimension (i.e. CD/width as seen along the Y direction). This is shown in FIG. 5a by the dash-dotted outline boxes 1022, 1032 indicating relaxed CD openings in an etch mask for opening the first and second mask features 1020, 1030. Since the first and second mask features 1020, 1030 are selectively etchable to the third mask feature(s) 1040, opening of the third mask feature 1040 from the openings 1020, 1030 may be counteracted.

The openings 1022, 1032 may as further shown extend to overlay part of the fin structure 300 at the first side, more specifically the capping layer 150. By etching the insulating material 106 selectively (also) to the capping layer 150, the source and drain trenches 308, 310 may hence be self-aligned with to the first side of the fin structure 300.

The source and drain trenches 308, 310 allow the channel layers 304 to be accessed and etched selectively to the dielectric layers 306 in the first and second regions 20, 30. This is shown in FIGS. 6a-d, where the channel layers 304 have been etched from the source trench 308 and the drain trench 310 such that a portion of each channel layer 304 has been removed within the first region 20, and the second region 30. A set of source and drain cavities 312, 314 may thereby be formed in the first and second regions 20, 30, respectively. A portion of each channel layer 304 remain to form a set of channel layer portions 112 in the third region 40.

Figure 6A:
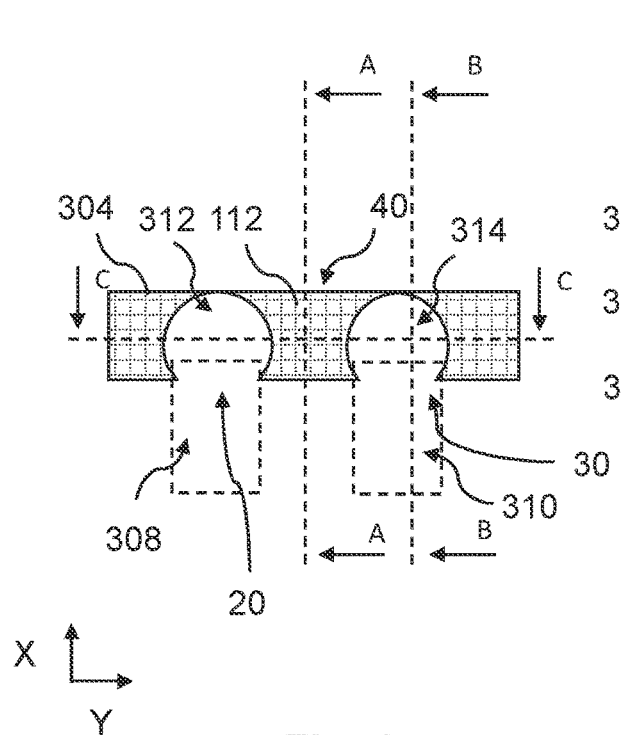
Figure 6B:
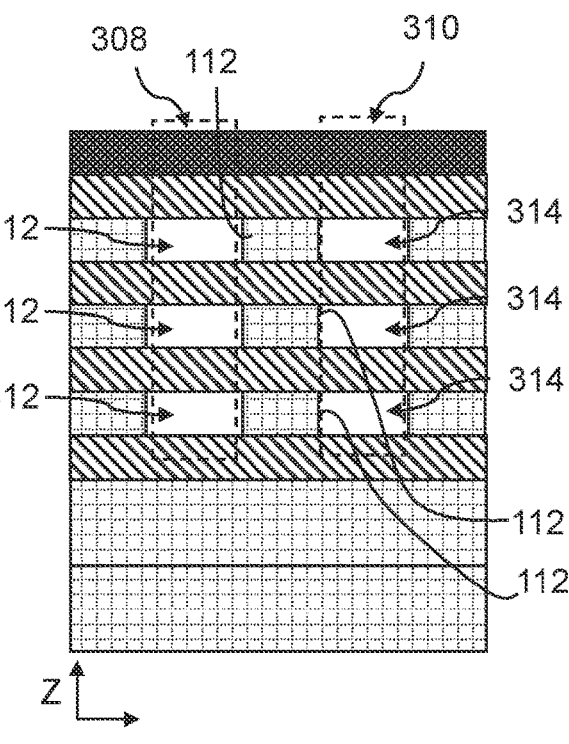
Figure 6C:
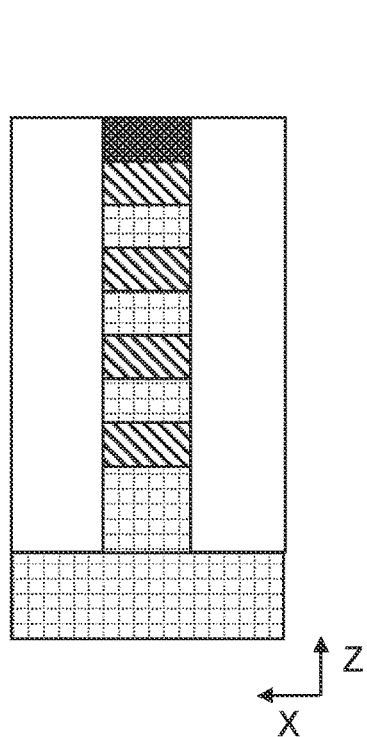

To facilitate understanding, the capping layer 150 and a dielectric layer 306 have been omitted from FIG. 6a to offer a top-down view of the fin structure 300 at a level of a channel layer 304. Additionally, the mask features 1020, 1030, 1040 etc. have been omitted for illustrative clarity. The mask features may however be present during the source and drain cavity formation.

Figure 6D:
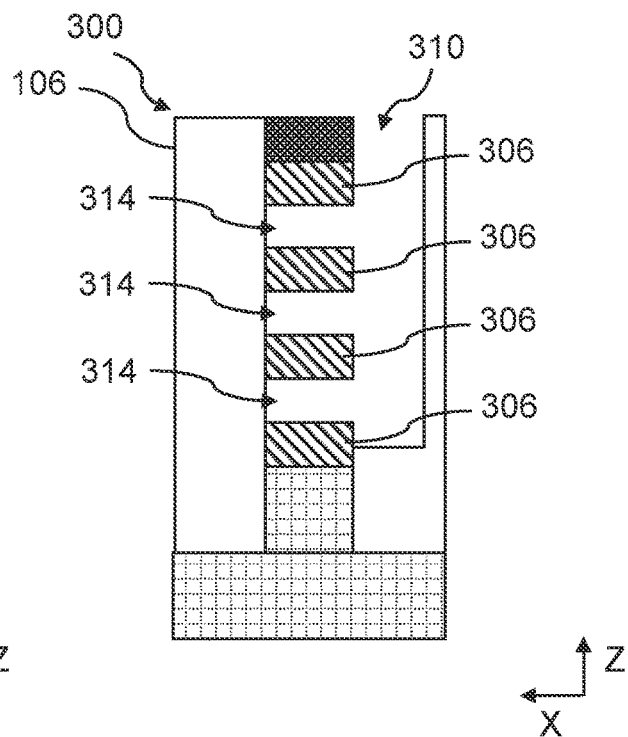
Figure 7A:
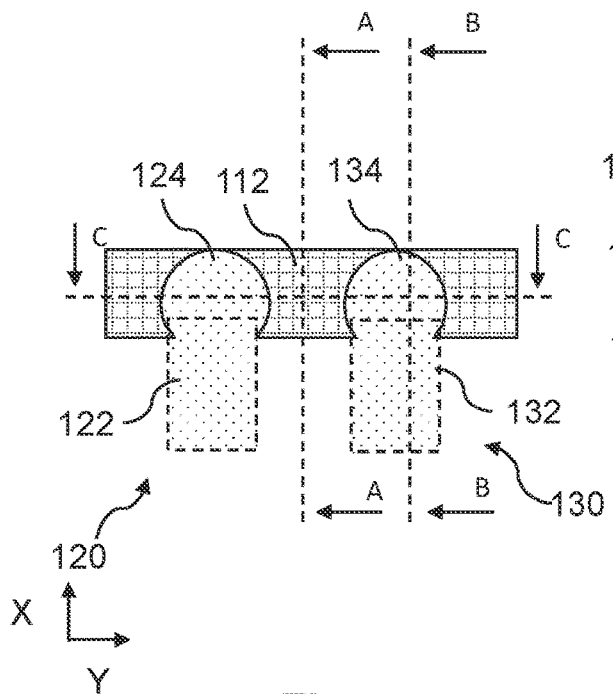
Figure 7B:
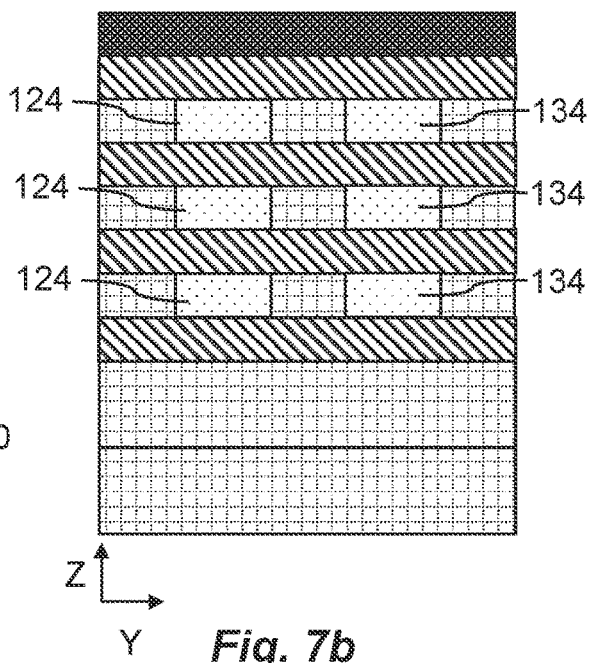
Figure 7C:
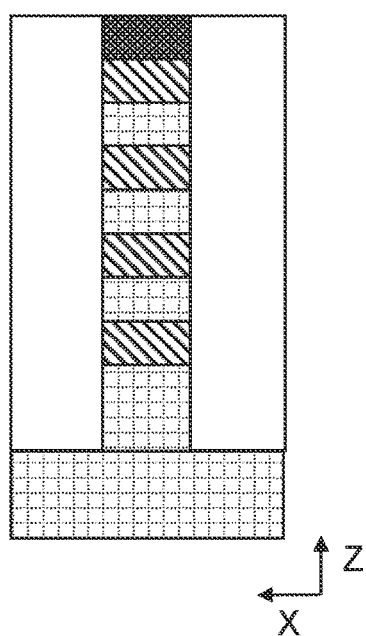
Figure 7D:
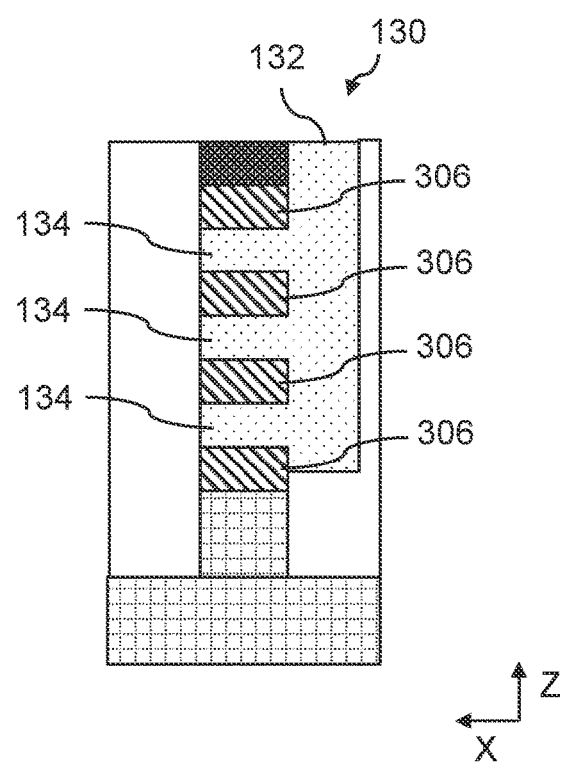
Figure 8A:
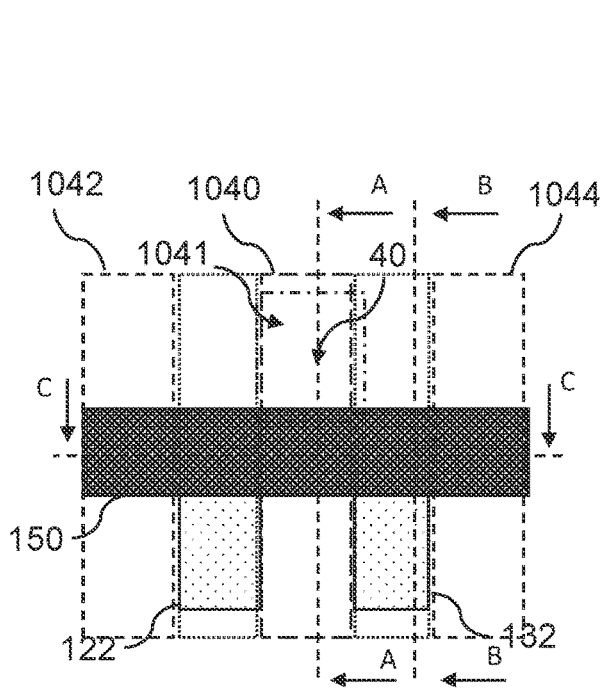
Figure 8B:
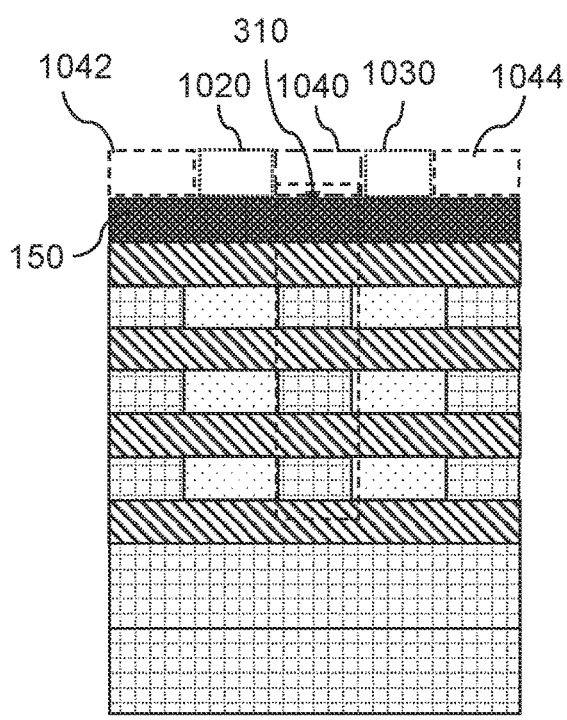
Figure 8C:
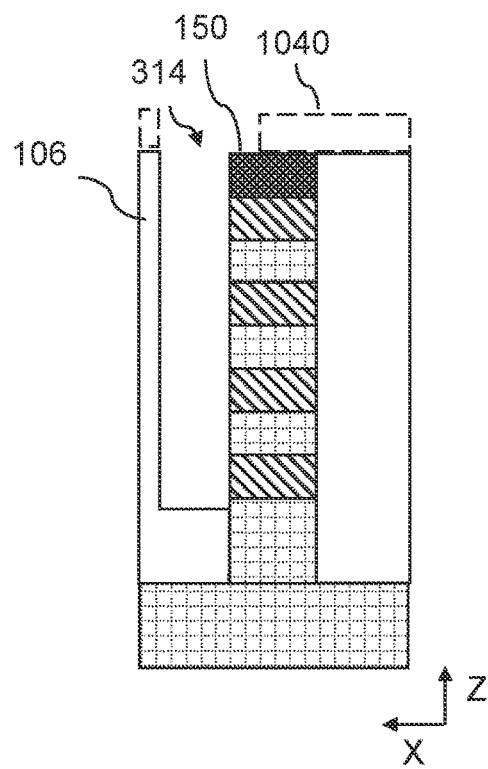
Figure 8D:
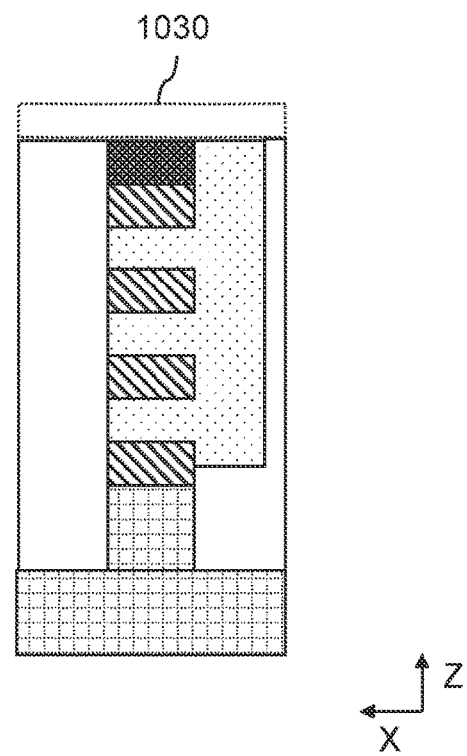

The sidewall portions of the channel layers 304 exposed in the source and drain trenches 308, 310 may be laterally etched back (along the X direction) from the source and drain trenches 308, 310. The channel layers 308, 310 may as shown in FIGS. 6a and 6d be etched back such that the source and drain cavities 312, 314 extend completely through the fin structure 300 (i.e. from the first side to the second side). The channel layers may be etched using a suitable isotropic etching process, wet or dry, TMAH (Tetramethylammonium hydroxide) or $Cl_2$, HCl, HBr-based etching chemistries being a few non-limiting examples.

Due to the isotropic nature of the etching process, the source and drain cavities 312, 314 may result in forming cavities with a curved/rounded shape. Moreover, the etching may, if precautions are not made, extend into portions of the channel layers 304 located in the third region 40. The aforementioned doping of the channel layers 304 in the first and second regions 20, 30 may however mitigate a risk of over-etching into the third region 40 by introducing an etch selectivity between the channel layer portions in the first and second regions 20, 30 and in the third region 40. Hence, the doped channel layer portions in first and second regions 20, 30 may be etched at a greater rate than the channel layer portions in the third region 40 (i.e. having a lower doping concentration). As shown in FIG. 6a, the cavity etch may thus be confined to the first and second regions 20, 30, at least substantially. Additionally or alternatively, the extension of the cavities 312, 314 along the fin structure 300 (i.e. along the Y direction) may be controlled via by reducing a width (along the Y direction) of the source and drain trenches 308, 310. That is a width of the source and drain trenches 308, 310 may be smaller than a (target) length (along the Y direction) of the first and second regions 20, 30. By a reduced width, shorter portions of the channel layers 304 may be exposed in the source and drain trenches 308, 310, allowing an amount of etching along the Y direction to be reduced.

In FIGS. 7a-d, a source body 120 of a source region 20 and a drain body 130 of a drain region 30 have been formed by epitaxy of a source and drain material. Typically a same semiconductor material may be used for the source and drain regions, wherein source material and drain material may refer to a same semiconductor material but deposited in the source and drain regions, respectively. The source/drain material may be doped, e.g. by in-situ doping, with an n- or p-type dopant.

By the epitaxy, a (doped) source layer prong 124 may be formed in each source cavity 312, in contact with an end of a respective channel layer portion 112 exposed in the source cavity 312. Correspondingly, a (doped) drain layer prong 134 may be formed in each drain cavity 314, in contact with an (opposite) end of a respective channel layer portion 112 exposed in the drain cavity 314. The source layer prongs 124 are vertically spaced apart by the dielectric layer (portions) 306 remaining in the first region 20. Correspondingly, the source layer prongs 134 are vertically spaced apart by the dielectric layer (portions) 306 remaining in the second region 30.

The epitaxy may as shown be continued such that the source/drain material merges in the source trench 308 and the drain material merges in the drain trench 310. A common "merged" source body portion 122 may hence be formed in the source trench 308. A common "merged" drain body portion 132 may be formed in the drain trench 310.

In FIGS. 8a-d, a gate trench 314 has been formed in the insulating material 106, beside the set of channel layer portions 112 in the third region 40. The gate trench 314 expose respective sidewall portions of the set of channel layer portions 112 and the dielectric layers 306 along the third region 40.

As indicated in the figures, the gate trench 314 may be formed selectively at the second side of the fin structure 300 to expose only sidewall portions of fin structure 300 facing the second side, while the directly opposite sidewall portion remains covered by the insulating material 106.

The gate trench 314 may be formed in a manner similar to the source and drain trenches 308, 310, e.g. by opening the third mask feature 1040 selectively to the first and second mask features 1020, 1030, at a location over the second side of the fin structure 300. The gate trench 314 may then be etched from the thusly formed opening in the third mask feature 1040.

The third mask feature 1040 may be opened using lithography and etching. In line with the discussion of the opening of the first and second mask features 1020, 1030, also the opening in the third mask feature 1040 may be formed by etching via a relaxed CD opening 1041 (dash-dotted outline) defined in an etch mask by lithography and etching.

Since the third mask feature 1040 is selectively etchable to the first and second mask features 1020, 1030, opening of the first and second mask features 1020, 1030 from the opening 1041 may be counteracted.

The opening 1041 may as further shown extend to overlay part of the fin structure 300 at the second side, more specifically the capping layer 150. By etching the insulating material 106 selectively to the capping layer 150, the gate trench 314 may hence be self-aligned with to the second side of the fin structure 300.

The gate trench allows the dielectric layers 306 to be accessed and etched selectively to the channel layer portions 112. This is shown in FIGS. 9a-d, where the dielectric layers 306 have been etched from the gate trench 314 such that a portion of each dielectric layer 306 has been removed within the third region 40. A set of gate cavities 316 exposing upper and lower surfaces of the set of channel layer portions 112 may thereby be formed in the third region 40. Portions of each dielectric layer 306 may remain to form a set of first dielectric layer portions 126 in the first/source region 20, and a set of second dielectric layer portions 136 in the second/drain region 30.

Figure 9A:
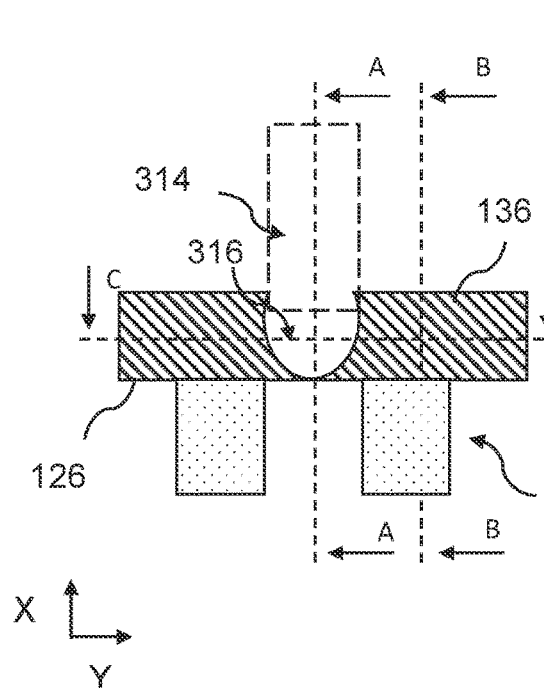
Figure 9B:
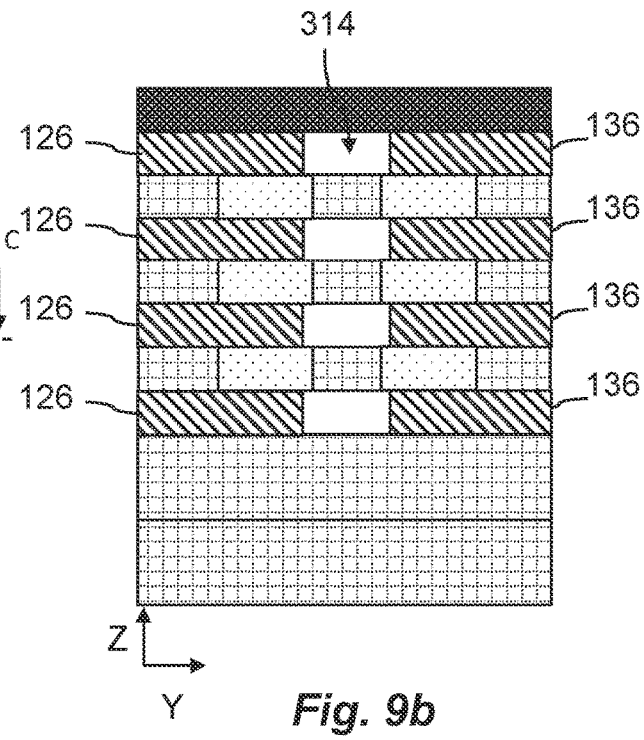

To facilitate understanding, the capping layer 150 has been omitted from FIG. 9a to offer a top-down view of the fin structure 300 at a level of a dielectric layer 306. Additionally, the mask features 1020, 1030, 1040 etc. have been omitted for illustrative clarity. The mask features may however be present during the gate cavity formation.

Figure 9C:
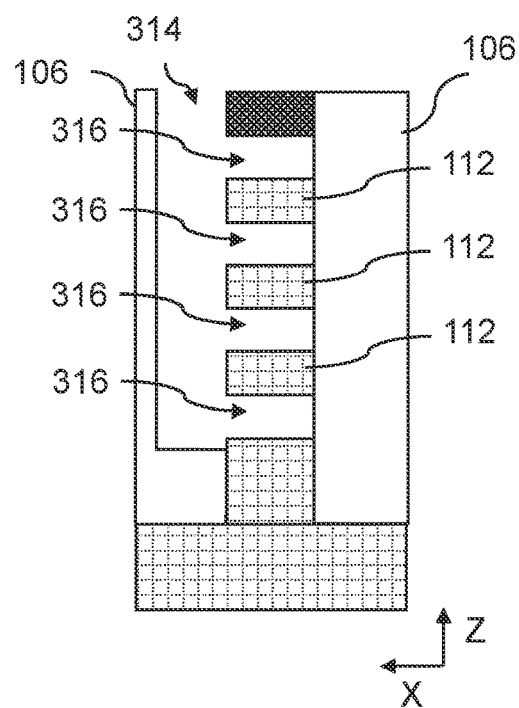
Figure 9D:
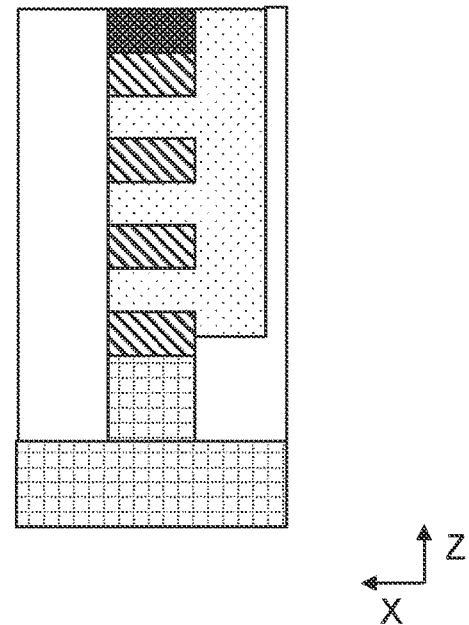
Figure 10A:
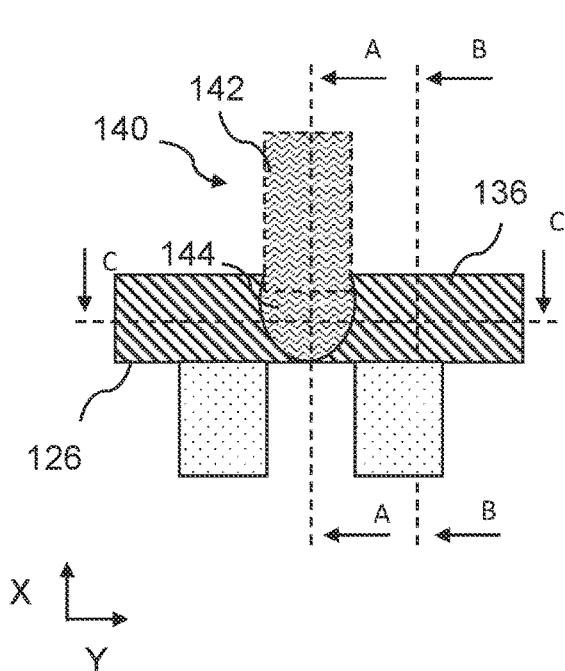
Figure 10B:
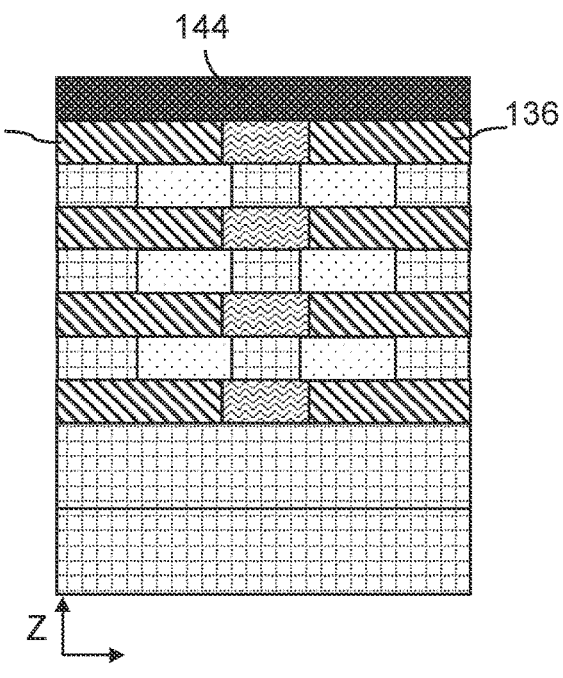
Figure 10C:
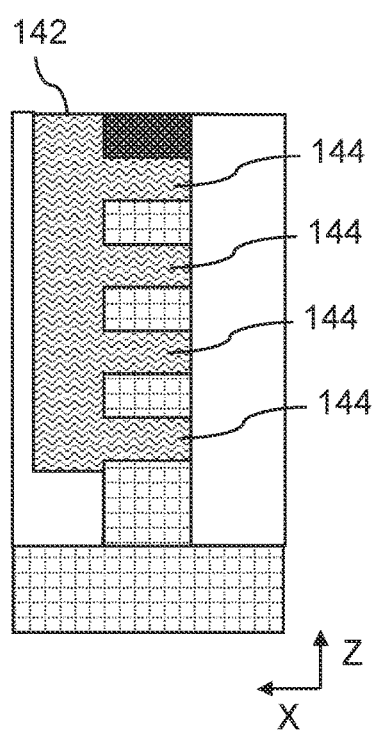
Figure 10D:
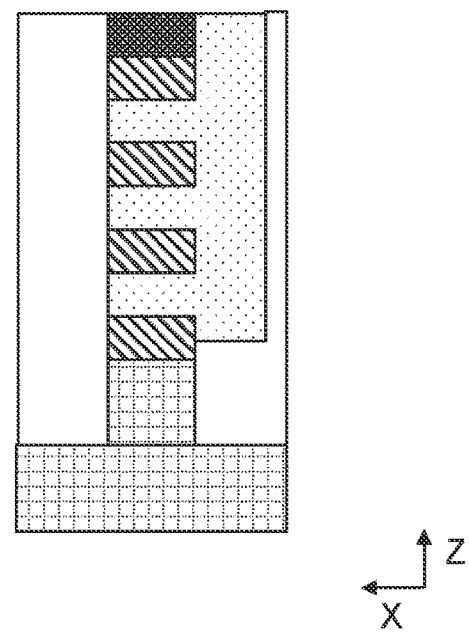

The sidewall portions of the dielectric layer 306 exposed in the gate trench 314 may be laterally etched back (against the X direction) from the gate trench 314. The dielectric layers 306 may as shown in FIGS. 9a and 9c be etched back such that the gate cavities 316 extend completely through the fin structure 300 (i.e. from the second side to the first side). The dielectric layers 306 may be etched using a suitable isotropic etching process, wet or dry. For example, SiN may be etched selectively to Si using $H_3PO_4$ or $CH_3F/O_2$ etching chemistries, while SiGeOx may be etched selectively to Si using diluted HF or $C_4F_8/O_2$.

Similar to the discussion of the etching of the source and drain cavities 312, 314, the gate cavities 316 may as show be formed with a curved/rounded shape. Moreover, the afore-mentioned doping of the dielectric layers 306 in the first and second regions 20, 30 may mitigate lateral over-etching into the first and second regions 20, 30 by introducing an etch selectivity between the dielectric layer portions in the first and second regions 20, 30 and in the third region 40. Hence, the un-doped dielectric layer portions may be etched at a greater rate than the dielectric layer portions in the first and second regions 20, 30 (i.e. having a greater doping concentration). The gate cavities 316 may thus be confined to the third region 40.

In FIGS. 10a-d, a gate body 140 has been formed, comprising a set of gate prongs 144 in the gate cavities 316, and a common gate portion 142 in the gate trench 314, merging the gate prongs 144. The gate body 140 may be formed by depositing a stack of gate materials (a "gate stack") comprising a gate dielectric layer, one or more gate WFM layers, and a gate electrode fill layer. These layers may e.g. be formed of any of the material examples discussed in connection with FIG. 2. At least the gate dielectric layer and the WFM layer(s) may be conformally deposited, e.g. by ALD, to facilitate deposition within the gate cavities 316.

After depositing the gate stack, portions of the gate stack deposited outside the gate trench 314 may be removed by polishing (e.g. chemical mechanical polishing) and/or etch back, thereby arriving at the final device structure 200 as shown in FIGS. 2a-d.

The above method is based on self-aligned techniques, e.g. by forming the source and drain trenches 308, 310, and the gate trench 314, in a self-aligned manner. However, techniques not relying on the first through third mask features providing self-alignment are also possible. For example, openings (e.g. with non-relaxed CDs) for the source and drain trenches 308, 310 may be lithographically defined in a photoresist-based etch mask provided on the insulating layer 106. The source and drain trenches 308, 310 may then be etched in the insulating material 106 from the openings in the etch mask. The gate trench 314 may be formed in a corresponding manner using a separate photoresist-based etch mask.

Figure 11:
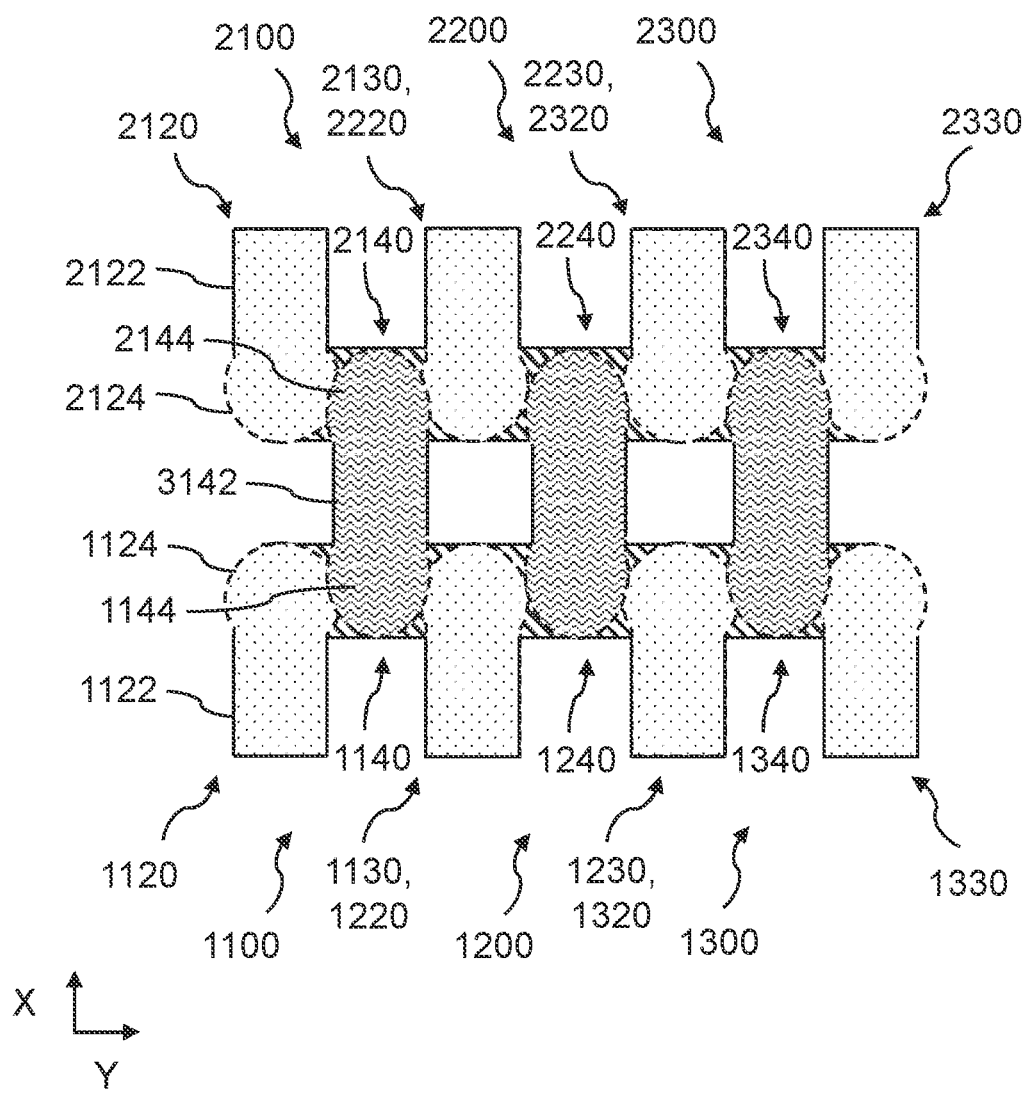
FIG. 11 is a top-down view of an arrangement of FET devices, according to an embodiment.

FIG. 11 shows a schematic top-down view of an arrangement of a first and a second FET device 1100, 2100, each FET device having a design according to the above described FET device 100 or 200.

The first and second device 1100, 2100 each comprise a respective source body 1120, 2120 (corresponding to source body 120 of device 100/200), a respective drain body 1130, 2130 (corresponding to drain body 130 of device 100/200), and a gate body 1140, 2140 (corresponding to gate body 140 of device 100/200). For illustrative purposes, the source bodies 1120, 2120, the drain bodies 1130, 2130, and the gate bodies 1140, 2140 are shown simultaneously to indicate their relative horizontal positions. It should however be understood that their respective prongs are located in different respective vertical device layers/levels.

The first and second device 1100, 2100 may be arranged beside each other (e.g. on a substrate) in a parallel fashion, i.e. such that the channel directions of the devices 1100, 2100 extend in parallel, (e.g. along the Y direction). The gate body 1140 of the first device 1100 and the gate body 2140 of the second device 2100 share a common gate body portion 3142 arranged intermediate the channel region of the first device 1100 and the channel region of the second device 2100. The gate prongs 1144 of the first device 1100 and the gate prongs 2144 of the second device 2100 thus protrude from the shared common gate body portion 3142 in opposite lateral directions (along the −X and +X the direction respectively). Correspondingly, the source prongs 1124 of device 1100 and the source prongs 2124 of device 2100 protrude from their respective source body portions 1122, 2122 in opposite lateral directions (along the +X and −X the direction respectively).

The arrangement may e.g. be comprised in a CMOS device wherein the first FET device 1100 may be an n-type FET and the second FET device may be a p-type FET 2100. The first and second FET devices 1100, 2100 may e.g. form part of a same circuit cell (e.g. a functional cell, a logic cell) of an integrated circuit.

The arrangement/circuit cell may as shown comprise a number of further corresponding FET devices e.g. device 1200 and 1300 aligned with/along a same "fin track" as the device 1100, and device 2200 and 2300 aligned with/along a same "fin track" as the device 2100. The devices 1100, 1200, 1300 and the devices 2100, 2200, 3200 may be formed along a same respective fin structure (e.g. the fin structure 300 and a second parallel fin structure), e.g. in accordance with the aforementioned method. Each of these further devices may comprise respective source bodies 1120, 1220, 1320, 2120, 2220, 2320, drain bodies 1130, 1230, 1330, 2130, 2230, 2330, and gate bodies 1140, 1240, 1340, 2140, 2240, 2340 (wherein corresponding features are indicated with reference signs with like last two digits). As shown, a drain body 1130 of a device (e.g. 1100) may form the source body (e.g. 1220) of a consecutive device (e.g. 1200), hence the double designation of features 1130/1220, 1230/1320, 2130/2220, 2230/2320.

Figure 12:
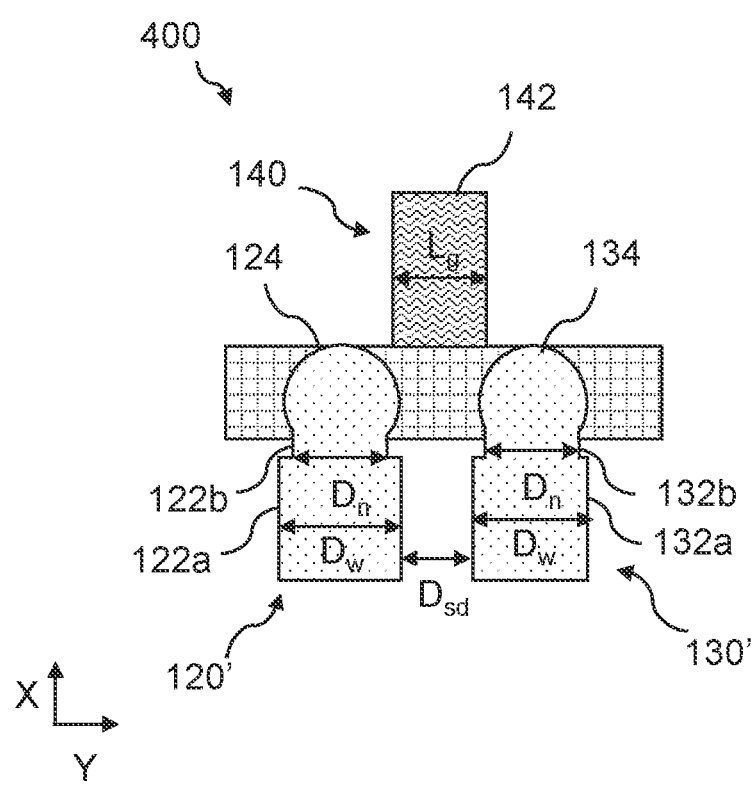
FIG. 12 is a top-down view of a FET device according to a further embodiment.

FIG. 12 is a schematic top-down view of a FET device 400 according to a further embodiment. The device 400 is generally of a same design and comprises same features as the device 200. The device 400 however differs by comprising a source body 120' and a drain body 130' which respectively comprises a wide portion 122a, 132a and a narrow portion 122b, 134b. The narrow portion 122b is arranged intermediate the wide portion 122a and the source layer prongs 124. The source layer prongs 124 protrude from the narrow portion 122b. The narrow portion 132b is arranged intermediate the wide portion 132a and the drain layer prongs 134. The drain layer prongs 124 protrude from the narrow portion 132b.

As shown in FIG. 12, a width dimension $D_w$ of the wide portions 122a, 132a exceeds a width dimension $D_n$ of the narrow portions 122b, 132b. As further shown the wide portions 122a, 132a may be formed such that a distance $D_{sd}$ between the wide portions 122a, 132a is less than a width dimension $L_g$ of the gate body 140 (which also may be denoted gate length).

The source and drain bodies 120, 130' of this further embodiment may be formed using a method like the above, but comprising forming each of the source and drain trenches 308, 310 with a wide portion and a narrow portion, the narrow portion being formed intermediate the wide portion and the fin structure 300, with a transverse dimension of the wide portion of the source/drain trench (e.g. $D_w$) exceeding a transverse dimension of the narrow portion of the source/drain trench (e.g. $D_n < D_w$). The reduced width of the narrow portions may facilitate confining the subsequent source and drain cavity etching to the first and second regions 20, 30, while the wide portions may allow facilitating source and drain contacting schemes, and allowing a reduced source/drain access resistance.

In the above the inventive concept has mainly been described with reference to a limited number of examples. However, as is readily appreciated by a person skilled in the art, other examples than the ones disclosed above are equally possible within the scope of the inventive concept, as defined by the appended claims.

For example, instead of forming the common source and drain body portions 122, 132 as merged epi-bodies, the source/drain epitaxy may be stopped after forming the source and drain layer prongs 124, 134, and subsequently a metal (e.g. W, Al or Cu) may be deposited in the source and drain trenches 308, 310, in contact with the source and drain layer prongs 124, 134, respectively. Hence, the source and drain bodies 120, 130 may be formed as a composite body of semiconductor source/drain layer prongs 124/134 and a common metal body portion 122, 132 merging the respective prongs 124, 134.

In a further variation, instead of forming the source and drain trenches 308, 310 prior to the gate trench 314, the sequence may be reversed such that the gate trench 314 and the gate body 340 may be formed prior to the source and drain trenches 308, 310.

It is also to be noted that, instead of applying a conversion step to a preliminary fin structure 300' to obtain the fin structure 300 comprising dielectric layers 306 and channel layers 304, it is possible to directly form the fin structure 300 by patterning fin structures 300 in a multi-layered SOI structure (e.g. $Si/SiO_2/Si/SiO_2/Si/$ . . . )

The invention claimed is:

1. A field-effect transistor, FET, device comprising:
a source region comprising a common source body portion and a set of vertically spaced apart source layer prongs protruding from the common source body portion in a first lateral direction, wherein first dielectric layer portions are arranged in spaces vertically between the source layer prongs,
a drain region comprising a common drain body portion and a set of vertically spaced apart drain layer prongs protruding from the common drain body portion in the first lateral direction, wherein second dielectric layer portions are arranged in spaces vertically between the drain layer prongs,
a gate body comprising a common gate body portion and a set of vertically spaced apart gate prongs protruding from the common gate body portion in a second lateral direction opposite the first lateral direction, each gate prong formed intermediate a respective pair of first and second dielectric layer portions, and
a channel region intermediate the source and drain regions and comprising a set of vertically spaced apart channel layer portions, each extending between a respective pair of source and drain layer prongs, wherein the channel layer portions are arranged in spaces between the gate prongs.

2. A FET device according to claim 1, wherein the common source body portion and the common drain body portion each is formed by a semiconductor material.

3. A FET device according to claim 1, wherein the common source body portion and the common drain body portion each is formed by a metal.

4. A FET device according to claim 1, wherein the common source body portion and the common drain body portion each comprise a wide portion and a narrow portion arranged intermediate the wide portion and the source and drain layer prongs, respectively, wherein a transverse dimension of the wide portion exceeds a transverse dimension of the narrow portion.

5. An arrangement of a first and a second FET device according to claim 1, arranged beside each other, wherein the gate body of the first FET device and the gate body of the second FET device share a common gate body portion arranged intermediate the channel region of the first FET device and the channel region of the second FET device, wherein the gate prongs of the first FET device and second FET device protrude from the shared common gate body portion in opposite lateral directions.

* * * * *